United States Patent
Choi et al.

(10) Patent No.: US 12,061,312 B2
(45) Date of Patent: Aug. 13, 2024

(54) AMORPHOUS BORON NITRIDE FILM AND ANTI-REFLECTION COATING STRUCTURE INCLUDING THE SAME

(71) Applicant: Samsung Electronics Co., Ltd., Suwon-si (KR)

(72) Inventors: Taejin Choi, Suwon-si (KR); Hyeonjin Shin, Suwon-si (KR); Changseok Lee, Gwacheon-si (KR); Sangwon Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 17/459,537

(22) Filed: Aug. 27, 2021

(65) Prior Publication Data
US 2022/0171098 A1 Jun. 2, 2022

(30) Foreign Application Priority Data
Nov. 30, 2020 (KR) .................. 10-2020-0165074

(51) Int. Cl.
| | | |
|---|---|---|
| G02B 1/113 | (2015.01) | |
| G02F 1/1335 | (2006.01) | |
| G03F 7/09 | (2006.01) | |
| H01L 21/027 | (2006.01) | |
| H01L 27/146 | (2006.01) | |
| H01L 31/0216 | (2014.01) | |
| H01L 31/052 | (2014.01) | |
| H10K 50/86 | (2023.01) | |

(52) U.S. Cl.
CPC ............. *G02B 1/113* (2013.01); *G03F 7/091* (2013.01); *H01L 21/0276* (2013.01); *H01L 27/1462* (2013.01); *H01L 27/14621* (2013.01); *H01L 27/14627* (2013.01); *H01L 27/14645* (2013.01); *H01L 31/02168* (2013.01); *H01L 31/052* (2013.01); *H10K 50/86* (2023.02); *G02F 1/133502* (2013.01)

(58) Field of Classification Search
None
See application file for complete search history.

(56) References Cited

U.S. PATENT DOCUMENTS

| | | |
|---|---|---|
| 5,646,474 A | 7/1997 | Pryor |
| 5,846,649 A | 12/1998 | Knapp et al. |
| 7,646,080 B2 | 1/2010 | Chen |
| 9,318,626 B2 | 4/2016 | Badi et al. |
| 9,422,161 B2 | 8/2016 | Tian et al. |
| 10,544,341 B2 | 1/2020 | Fujikawa et al. |
| 10,745,808 B2 | 8/2020 | Lei et al. |
| 11,086,223 B2 | 8/2021 | Shin et al. |
| 2002/0187629 A1 | 12/2002 | Huang et al. |
| 2008/0292798 A1 | 11/2008 | Huh et al. |
| 2009/0017314 A1 | 1/2009 | Nadaud et al. |
| 2011/0230122 A1 | 9/2011 | Le Godec et al. |
| 2013/0277601 A1 | 10/2013 | Kurita et al. |
| 2017/0271154 A1 | 9/2017 | Shin et al. |
| 2018/0144930 A1 | 5/2018 | Glavin et al. |
| 2018/0265416 A1 | 9/2018 | Ishida et al. |
| 2021/0123161 A1 | 4/2021 | Lee et al. |

FOREIGN PATENT DOCUMENTS

| | | |
|---|---|---|
| EP | 3817031 A1 | 5/2021 |
| EP | 3817051 A1 | 5/2021 |
| FR | 2889202 A1 | 2/2007 |
| JP | 2010/267543 A | 11/2010 |
| JP | 4946049 B2 | 6/2012 |
| JP | 6375140 B2 | 8/2018 |
| KR | 2009/0124097 A | 12/2009 |
| KR | 2016/0118782 A | 10/2016 |
| KR | 2017/0012129 A | 2/2017 |

OTHER PUBLICATIONS

Higuchi et al. (Surface & Coatings Technology 377 (2019) 124854). (Year: 2019).*
Extended European Search Report dated Mar. 1, 2022, issued in corresponding European Patent Application No. 21195678.4.
J.L. Andújar et al., 'Plasma-enhanced chemical vapor deposition of boron nitride thin films from $B_2H_6$—$H_2$—$NH_3$ and $B_2H_6$—$N_2$ gas mixtures' *Journal of Vacuum Science and Technology*, vol. 16, No. 2, 1998, pp. 578-586.
Seokmo Hong et al., 'Ultralow-dielectric-constant amorphous boron nitride' *Nature*, vol. 582, Jun. 2020, pp. 511-526.
Canon Professional eXchange, "ASC: Reduction of Flare and Ghosting" retrieved Apr. 14, 2021 at https://www.canon.com.hk/cpx/en/technical/pa_ASCReduction_of_Flare_and_Ghosting.html.
Hannes Kruger et al., 'Transparent $MgF_2$-films by sol-gel coating: Synthesis and optical properties' *Thin Solid Films*, vol. 516, 2008, pp. 4175-4177.
Kyungyul Ryu et al., 'Optimal indium tin oxide layer as anti reflection coating for crystalline silicon solar cell with shallow emitter' *Thin Solid Films*, vol. 521, 2012, pp. 50-53.
Ki-Seong Lee et al., 'A Study on Transparent Electrode Properties of Indium Tin Oxide Thin Films Deposited From Recycled Target' *Bulletin of the Korean Chemical Society*, 2020.
Ki Kang Kim et al., 'Synthesis and Characterization of Hexagonal Boron Nitride Film as a Dielectric Layer for Graphene Devices' *ACS Nano*, vol. 6, No. 10, 2012, pp. 8583-8590.

(Continued)

*Primary Examiner* — Robert T Butcher
(74) *Attorney, Agent, or Firm* — Harness, Dickey & Pierce, P.L.C.

(57) ABSTRACT

Provided are an amorphous boron nitride film and an anti-reflection coating structure including the amorphous boron nitride film. The amorphous boron nitride film has an amorphous structure including an $sp^3$ hybrid bond and an $sp^2$ hybrid bond, in which a ratio of the $sp^3$ hybrid bond in the amorphous boron nitride film is less than about 20%.

28 Claims, 18 Drawing Sheets

(56) References Cited

OTHER PUBLICATIONS

H. K. Chen et al., 'Oxidation characteristics of MgF2 in air at high temperature' *IOP Conf. Ser.: Mater. Sci. Eng.* 170, 2017, 012035.

Obert R. Wood II et al., 'Vacuum ultraviolet loss in magnesium fluoride films' *Applied Optics*, vol. 23, No. 20, Oct. 1984, pp. 3644-3649.

Jonathan Moghal et al., 'High-Performance, Single-Layer Antireflective Optical Coatings Comprising Mesoporous Silica Nanoparticles' *ACS Applied Materials and Interfaces*, vol. 4, 2012, pp. 854-859.

Sang Won Kim et al., 'Graphene-Based Etch Resist for Semiconductor Device Fabrication' *ACS Applied Nano Materials*, 3, 2020, pp. 4635-4641.

Extended European Search Report dated Mar. 21, 2022, issued in corresponding European Patent Application No. 21200908.8.

Glavin et al. (2016), Amorphous Boron Nitride: A Universal, Ultrathin Dielectric For 2D Nanoelectronics, *Adv. Funct. Mater.*, (Year: 2016).

Office Action dated Aug. 28, 2023, issued in corresponding U.S. Appl. No. 17/459,538.

Office Action dated Dec. 26, 2023, issued in corresponding U.S. Appl. No. 17/459,538.

\* cited by examiner

AMORPHOUS BORON NITRIDE FILM AND ANTI-REFLECTION COATING STRUCTURE INCLUDING THE SAME

CROSS-REFERENCE TO RELATED APPLICATION

This application is based on and claims priority under 35 U.S.C. § 119 to Korean Patent Application No. 10-2020-0165074, filed on Nov. 30, 2020 in the Korean Intellectual Property Office, the disclosure of which is incorporated by reference herein in its entirety.

BACKGROUND

1. Field

The disclosure relates to an amorphous boron nitride film and an anti-reflection coating structure including the same.

2. Description of the Related Art

In a display device such as a liquid crystal display (LCD) device or an organic light-emitting display (OLED) device, a problem of contrast decrease or image overlap may occur due to the reflection of external light, and thus, in order to solve this problem, an anti-reflection film may need to be provided.

SUMMARY

Provided is an amorphous boron nitride film and an anti-reflection coating structure including the same.

Additional aspects will be set forth in part in the description which follows and, in part, will be apparent from the description, or may be learned by practice of the presented embodiments of the disclosure.

In an embodiment, an amorphous boron nitride film has an amorphous structure, the amorphous structure including an $sp^3$ hybrid bond and an $sp^2$ hybrid bond. A ratio of the $sp^3$ hybrid bond in the amorphous boron nitride film may be less than about 20%.

In some embodiments, the refractive index of the amorphous boron nitride film with respect to light in a wavelength range of about 100 nm to about 1000 nm may be about 1.0 to about 1.5.

In some embodiments, a content ratio of boron to nitrogen in the amorphous boron nitride film may be about 0.5 to about 2.0.

In some embodiments, a surface roughness of the amorphous boron nitride film may be about 0.5 rms (root-mean-square) or less.

In some embodiments, a dielectric constant of the amorphous boron nitride film may be about 2.5 or less.

In some embodiments, an energy bandgap of the amorphous boron nitride film may be about 6.0 eV or less.

In some embodiments, a density of an amorphous boron nitride film may be about 1.8 $g/cm^3$ or more.

In some embodiments, a hydrogen content of the amorphous boron nitride film may be less than about 10 at %.

In an embodiment, an anti-reflection coating structure includes a substrate and an amorphous boron nitride film on the substrate and having an amorphous structure. The amorphous structure may include a $sp^3$ hybrid bond and a $sp^2$ hybrid bond. A ratio of the $sp^3$ hybrid bond in the amorphous boron nitride film may be less than about 20%.

In some embodiments, a refractive index of the amorphous boron nitride film with respect to light in a wavelength range of about 100 nm to about 1000 nm may be about 1.0 to about 1.5.

In some embodiments, a thickness of the amorphous boron nitride film may be ¼ of a center wavelength of light incident on the amorphous boron nitride film.

In some embodiments, a density of the amorphous boron nitride film may be about 1.8 $g/cm^3$ or more.

In some embodiments, at least one material layer may be further provided between the substrate and the amorphous boron nitride film. The at least one material layer may have a refractive index greater than a refractive index of the amorphous boron nitride film.

In an embodiment, an image sensor may include a substrate, a plurality of photodiodes on the substrate in a two-dimensional form, a color filter layer on the plurality of photodiodes, and an amorphous boron nitride film on the plurality of photodiodes and having an amorphous structure. The amorphous structure may include an $sp^3$ hybrid bond and an $sp^2$ hybrid bond. A ratio of the $sp^3$ hybrid bond in the amorphous boron nitride film may be less than about 20%.

In some embodiments, the amorphous boron nitride film may be between the plurality of photodiodes and the color filter layer.

In some embodiments, the refractive index of the amorphous boron nitride film with respect to light in a wavelength range of about 100 nm to about 1000 nm may be about 1.0 to about 1.5.

In some embodiments, the image sensor may further include a plurality of microlenses on the color filter layer in a two-dimensional form.

In an embodiment, a lithographic device include may include a substrate, a photoresist layer on the substrate, and an amorphous boron nitride film between the substrate and the photoresist layer and having an amorphous structure. The amorphous structure may include an $sp^3$ hybrid bond and an $sp^2$ hybrid bond. A ratio of the $sp^3$ hybrid bond in the amorphous boron nitride film may be less than about 20%.

In some embodiments, a refractive index of the amorphous boron nitride film with respect to light in a wavelength range of about 100 nm to about 1000 nm may be about 1.0 to about 1.5.

In some embodiments, a surface roughness of the amorphous boron nitride film may be about 0.5 rms or less.

In an embodiment, a solar cell may include a light absorption layer that absorbs Incident light and generates electric energy, and an amorphous boron nitride film on the light absorption layer and having an amorphous structure. The amorphous structure may include an $sp^3$ hybrid bond and an $sp^2$ hybrid bond. A ratio of the $sp^3$ hybrid bond in the amorphous boron nitride film may be less than about 20%.

In some embodiments, a refractive index of the amorphous boron nitride film with respect to light in a wavelength range of about 100 nm to about 1000 nm may be about 1.0 to about 1.5.

In some embodiments, a heat spreading layer may be between the light absorption layer and the amorphous boron nitride film.

In an embodiment, a display device may include a display panel, and an amorphous boron nitride film on the display panel and having an amorphous structure, the amorphous structure including an $sp^3$ hybrid bond and an $sp^2$ hybrid bond, wherein a ratio of the $sp^3$ hybrid bond in the amorphous boron nitride film may be less than about 20%.

In some embodiments, a refractive index of the amorphous boron nitride film with respect to light in a wavelength range of about 100 nm to about 1000 nm may be about 1.0 to about 1.5.

In some embodiments, a protection film may be between the display panel and the amorphous boron nitride film. The protection film may have a refractive index greater than a refractive index of the amorphous boron nitride film.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
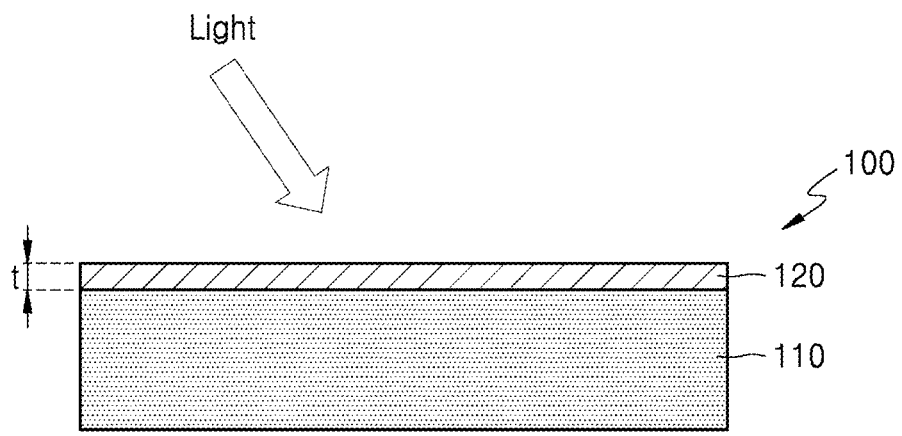
FIG. 1 is a view of an anti-reflection coating structure of according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. The thickness or size of each layer illustrated in the drawings may be exaggerated for convenience of explanation and clarity. In this regard, the present embodiments may have different forms and should not be construed as being limited to the descriptions set forth herein. Accordingly, the embodiments are merely described below, by referring to the figures, to explain aspects of the present description.

In the layer structure described below, when a constituent element is disposed "above" or "on" to another constituent element, the constituent element may include not only an element directly contacting on the upper/lower/left/right sides of the other constituent element, but also an element disposed above/under/left/right the other constituent element in a non-contact manner. The expression of singularity in the specification includes the expression of plurality unless clearly specified otherwise in context. It will be further understood that the terms "comprises" and/or "comprising" used herein specify the presence of stated features or components, but do not preclude the presence or addition of one or more other features or components As used herein, the singular forms "a," "an" and "the" are intended to include the plural forms as well, unless the context clearly indicates otherwise. Also, the steps of all methods described herein can be performed in any suitable order unless otherwise indicated herein or otherwise clearly contradicted by context. The disclosure is not limited to the described order of the steps.

Furthermore, terms such as "portion," "unit," "module," and "block" stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure unless otherwise claimed.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a view of an anti-reflection coating structure 100 according to an embodiment.

Referring to FIG. 1, the anti-reflection coating structure 100 may include a substrate 110 and an amorphous boron nitride film 120 provided on the substrate 110. The anti-reflection coating structure 100 may include various devices such as image sensors, lithography devices, solar cells, display devices, and the like.

The substrate 110 may be an object that may require anti-reflection of light. The substrate 110 is provided with the amorphous boron nitride film 120. The amorphous boron nitride film 120 may function as an anti-reflection film.

In the following description, a crystalline boron nitride film, a nanocrystalline boron nitride film, and an amorphous boron nitride film are described.

A crystalline boron nitride film may be a boron nitride film including crystal grains having a size of about 100 nm or more. The crystalline boron nitride film may include, for example, a hexagonal boron nitride film (h-BN) or a cubic boron nitride film (c-BN).

A nanocrystalline boron nitride film (nc-BN) may be a boron nitride film including crystal grains having a size less than the crystalline boron nitride film. The nanocrystalline boron nitride film may include crystal grains having a size of about 100 nm or less. In detail, for example, the nanocrystalline boron nitride film may include crystal grains having a size of about 0.5 nm to about 100 nm.

The amorphous boron nitride film (a-BN) 120 may be a boron nitride film having a non-crystalline structure. The amorphous boron nitride film 120 may include an $sp^3$ hybrid bond and an $sp^2$ hybrid bond, in which a ratio of the $sp^3$ hybrid bond in the amorphous boron nitride film 120 may be less than about 20%. Specifically, a ratio of [sp3 hybrid bond]/[sp2 bond and sp3 hybrid bond] is less than about 20%. The amorphous boron nitride film 120 may additionally include a small amount of crystal grains having a size of about several nanometers, for example, about 3 nm or less.

In the amorphous boron nitride film 120, a content ratio of boron to nitrogen may be, for example, about 0.5 to about 2.0. In a specific example, the content ratio of boron to nitrogen may be about 0.9 to about 1.1. However, the disclosure is not limited thereto.

The amorphous boron nitride film 120 may include more hydrogen, but the hydrogen content may be relatively small. For example, the hydrogen content may be less than about 10 at % (atomic percent). As the hydrogen content in the amorphous boron nitride film 120 may be small, the amorphous boron nitride film 120 may be chemically stable.

The amorphous boron nitride film 120 may have a low refractive index. For example, a refractive index of the amorphous boron nitride film 120 may be about 1.0 to about 1.5 with respect to light in a wavelength range of about 100 nm to about 1000 nm.

The amorphous boron nitride film 120 may have a low dielectric constant. For example, a dielectric constant of the amorphous boron nitride film 120 may be about 2.5 or less. In detail, for example, the dielectric constant of the amorphous boron nitride film 120 may be about 1.0 to about 2.5.

The amorphous boron nitride film 120 may have a high density. For example, a density of the amorphous boron nitride film 120 may be about 1.8 g/cm$^3$ or more. In detail for example, the density of the amorphous boron nitride film 120 may be about 1.8 g/cm$^3$ to about 2.5 g/cm$^3$. As such, as the amorphous boron nitride film 120 may have a high density, the amorphous boron nitride film 120 may have excellent mechanical characteristics.

An energy bandgap of the amorphous boron nitride film 120 may be about 6.0 eV or less. Furthermore, the surface roughness of the amorphous boron nitride film 120 may be 0.5 root-mean-square (rms) or less.

As the amorphous boron nitride film 120, as described above, has a low refractive index and excellent thermal, mechanical, and chemical stability, the anti-reflection coating structure 100 may be implemented by using the amorphous boron nitride film 120 as an anti-reflection film.

The amorphous boron nitride film 120 may be formed to have a thickness t that satisfies conditions for destructive interference of reflected light at an interface between air and the amorphous boron nitride film 120 to reduce reflectivity. For example, when a center wavelength of light incident on the anti-reflection coating structure 100 is λ, the amorphous boron nitride film 120 having a thickness t of about λ/4 may reduce reflectivity. In an example, when incident light has a wavelength of about 400 nm, the amorphous boron nitride film 120 may be formed on the substrate 110 to a thickness of about 100 nm, thereby reducing reflectivity. Furthermore, when incident light has a wavelength range of about 300 nm to about 800 nm, as the center wavelength of the incident light is about 550 nm, the amorphous boron nitride film 120 may be formed on the substrate 110 to have a thickness of about 135 nm to about 140 nm, thereby reducing reflectivity.

Figure 2A:
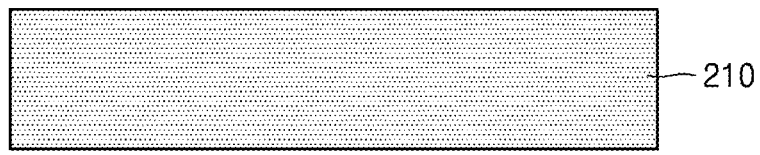
FIGS. 2A to 2C are views of a method of forming an amorphous boron nitride film, according to an embodiment.
Figure 2B:
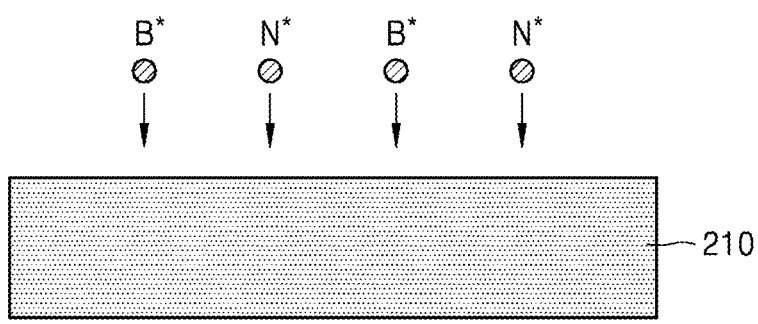
Figure 2C:
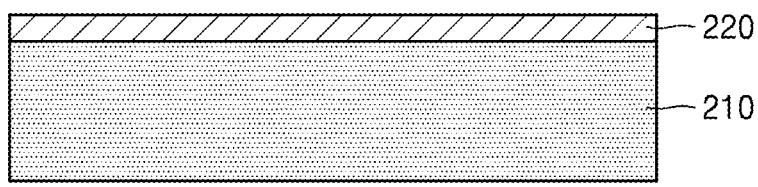

In the following description, a method of forming the amorphous boron nitride film 120 described above using plasma enhanced chemical vapor deposition (PECVD) is described. FIGS. 2A to 2C are views of a method of forming an amorphous boron nitride film, according to an embodiment.

Referring to FIG. 2A, a substrate 210 is prepared in a process chamber (not shown). The substrate 210 may be the substrate 110 that limits and/or prevents reflection in the anti-reflection coating structure 100 of FIG. 1. In this case, the substrate 210 may be a structure employed in various devices such as image sensors, lithography devices, solar cells, display devices, and the like.

The substrate 210 may be a substrate for growth of an amorphous boron nitride film 220 of FIG. 2C. In this case, the substrate 210 may include various materials. For example, the substrate 210 may include at least one of a semiconductor material, an insulating material, or metal. The semiconductor material may include Group IV semiconductors or semiconductor compounds. The Group IV semiconductors may include, for example, Si, Ge, Sn, and the like, but the disclosure is not limited thereto. The semiconductor compounds may include a material obtained by combining at least two elements of, for example, Si, Ge, C, Zn, Cd, Al, Ga, In, B, C, N, P, S, Se, As, Sb, or Te. However, the disclosure is not limited thereto.

The insulating material may include at least one of an oxide, a nitride, a carbide, or a derivative thereof of at least one of, for example, Si, Ni, Al, W, Ru, Co, Mn, Ti, Ta, Au, Hf, Zr, Zn, Y, Cr, Cu, Mo, or Gd. Furthermore, the substrate 210 may further include, for example, N or F in a SiCOH-based composition, and may include pores to lower permittivity. The substrate 210 may further include a dopant. However, the above-described materials of the substrate 210 are merely examples.

Before the substrate 210 is arranged in the process chamber, the substrate 210 may be pre-treated. For example, the substrate 210 may undergo an ultrasound-treatment by being dipped in an organic solvent such as acetone, and then may be cleaned with iso-propyl alcohol (IPA) and nitrogen gas. By performing a plasma treatment using oxygen hydrogen, $NH_3$, and the like on the cleaned surface of the substrate 210, carbon impurities remaining on the surface thereof may be removed. Furthermore, a natural oxide may be removed by dipping the substrate 210 in an HF solution, and a residual HF solution may be removed by using anhydrous ethanol nitrogen gas.

A process temperature to grow the amorphous boron nitride film 220 may be lower than a temperature used in a typical chemical vapor deposition (CVD) process. The process temperature to grow the amorphous boron nitride film 220 may be about 400° C. or less. For example, the process temperature to grow the amorphous boron nitride film 220 may be about 15° C. to about 400° C. When the process temperature is greater than about 400° C. and about 700° C. or less, a nanocrystalline boron nitride film may be formed, but the disclosure is not limited thereto.

A process pressure to grow the amorphous boron nitride film 220 may be about 10 mTorr or more. For example, the process pressure to grow the amorphous boron nitride film 220 may be about 10 mTorr to about 1 Torr.

Next, a reaction gas to grow the amorphous boron nitride film 220 is injected into the process chamber. The reaction gas may include a boron nitride source to grow the amorphous boron nitride film 220.

The boron nitride source may be a source including both of nitrogen and boron such as borazine ($B_3N_3H_6$), ammonia-borane ($NH_3$—$BH_3$), and the like. Furthermore, the boron nitride source may include a nitrogen source including nitrogen and a boron source including boron. The nitrogen source may include at least one of, for example, ammonia ($NH_3$) or nitrogen ($N_2$), and the boron source may include at least one of $BH_3$, $BF_3$, $BCl_3$, $B_2H_6$, $(CH_3)_3B$, and $(CH_3CH_2)_3B$.

The reaction gas may further include an inert gas. The inert gas may include at least one of, for example, argon gas, neon gas, nitrogen gas, helium gas, krypton gas, or xenon gas. Furthermore, the reaction gas may further include hydrogen gas to promote activation by plasma. FIG. 2A illustrates an example in which borazine ($B_3N_3H_6$) is used as the boron nitride source and argon gas is used as the inert gas.

A mixing ratio of the reaction gas injected into the process chamber may be adjusted by controlling flow rates of a boron nitride source, inert gas and hydrogen gas injected into the process chamber. In order to form the amorphous boron nitride film 220, the content of the boron nitride source needs to be relatively small in reaction gas. To this end, the flow rate of the boron nitride source introduced into the process chamber may be relatively low.

The volume ratio of the boron nitride source and the inert gas injected into the process chamber to form the amorphous boron nitride film 220 may be, for example, about 1:10-5000, and the volume ratio of the boron nitride source, the inert gas, and the hydrogen gas may be, for example, about 1:10-5000:10-500.

As such, as the volume ratio of the boron nitride source in the reaction gas is small, the amorphous boron nitride film 220 hardly having crystallinity may be formed on the surface of the substrate 210.

When an excessive amount of the boron nitride source is supplied into the process chamber, the amorphous boron nitride film 220 may irregularly grow and adsorption of a precursor may occur. To limit and/or prevent these issues, the flow rate of the boron nitride source may be low. For example, the flow rate of the boron nitride source may be about 0.05 standard cubic centimeters (sccm), and the flow rate of the inert gas may be about 50 sccm, but the disclosure is not limited thereto. Furthermore, the flow rate of the hydrogen gas may be about 50 sccm or more, but the disclosure is not limited thereto.

Next, in a process of introducing the reaction gas into the process chamber, plasma may be generated in the process chamber by a plasma apparatus. Power to generate plasma may be, for example, about 10 W to about 4000 W. In a specific example, the power to generate plasma may be about 60 W, but the disclosure is not limited thereto.

The plasma apparatus may be an apparatus that provides inductively coupled plasma (ICP), microwave plasma, capacitively coupled discharge plasma, electron cyclotron resonance (ECR) plasma, helicon plasma, and the like, but the disclosure is not limited thereto. When the power to generate plasma is applied from the plasma apparatus into the process chamber, an electric field is induced in the process chamber and plasma to grow the amorphous boron nitride film 220 may be generated by the induced electric field.

Referring to FIG. 2B, nitrogen atoms and boron atoms may be activated by the plasma of the reaction gas in which the boron nitride source, the inert gas, and the hydrogen gas are mixed, and an activated nitrogen atom (N*) and an activated boron atom (B*) may be adsorbed on the surface of the substrate 210. As the plasma of the inert gas continuously induces activation of the substrate 210, the adsorption of the activated nitrogen (N*) and the activated boron (B*) on the surface of the substrate 210 may be accelerated.

Referring to FIG. 2C, as the adsorption of the activated nitrogen (N*) and the activated boron (B*) on the surface of the substrate 210 is accelerated, the amorphous boron nitride film 220 may grow on the surface of the substrate 210. As a relatively low content of the activated nitrogen (N*) and the activated boron (B*) is adsorbed on the surface of the substrate 210 at a low temperature, that is, a temperature of 400° C. or less, the amorphous boron nitride film 220 hardly having crystallinity may grow to be formed on the surface of the substrate 210.

Although a case in which the amorphous boron nitride film 220 is directly grown on the substrate 210 is described, the amorphous boron nitride film 220 formed on the substrate 210 may be separated from the substrate 210 and transferred to another substrate or device.

The amorphous boron nitride film 220 formed by the method described above has an amorphous structure including an $sp^3$ hybrid bond and an $sp^2$ hybrid bond, in which a ratio of the $sp^3$ hybrid bond in the amorphous boron nitride film 220 may be less than about 20%. The ratio of the $sp^3$ hybrid bond in the amorphous boron nitride film 220 may be measured through, for example, an X-ray photoelectron spectroscopy (XPS) analysis. The amorphous boron nitride film 220 may additionally include crystal grains having a size of several nanometers, for example, about 3 nm or less.

In a process of forming the amorphous boron nitride film 220 described above, a nanocrystalline boron nitride film may be formed by changing process conditions, for example, a process temperature, a process pressure, and the like. The nanocrystalline boron nitride film may include crystal grains having a size of about 100 nm or less.

In the amorphous boron nitride film 220, the content ratio of boron to nitrogen may be, for example, about 0.5 to about 2.0. In a specific example, the content ratio of boron to nitrogen may be about 0.9 to about 1.1. Furthermore, the amorphous boron nitride film 220 may further include hydrogen. In this case, the hydrogen content may be, for example, less than about 10 at %.

The amorphous boron nitride film 220 may have a low refractive index of about 1.0 to about 1.5 with respect to the light in a wavelength range of about 100 nm to about 1000 nm. Furthermore, the amorphous boron nitride film 220 may have a low dielectric constant of about 2.5 or less. In detail, for example, the dielectric constant of the amorphous boron nitride film 220 may be about 1.0 to about 2.5.

The amorphous boron nitride film 220 may have a high density of about 1.8 g/cm$^3$ or more. The amorphous boron nitride film 220 may have a surface roughness of about 0.5 rms or less. The amorphous boron nitride film 220 may have an energy bandgap of about 6.0 eV or less.

The amorphous boron nitride film 220 described above may function as an anti-reflection film as illustrated in FIG. 1. A device may be fabricated by forming other layers on the amorphous boron nitride film 220. Furthermore, the amorphous boron nitride film 220 may be separated from the substrate 210 to be transferred to another substrate or device and may function as an anti-reflection film.

[Table 1] shows an example test result of comparing the characteristics of a crystalline boron nitride film (in detail, h-BN), a nanocrystalline boron nitride film (nc-BN), and an amorphous boron nitride film (a-BN).

TABLE 1

|  | h-BN | nc-BN | a-BN |
| --- | --- | --- | --- |
| Refractive Index @ 633 nm | 2.16 | 1.8~2.3 | 1.37 |
| Density (g/cm$^3$) | 2.1 |  | 2.1~2.3 |
| Dielectric Constant | 3~3.5 | 2.0~3.0 | 1.5~2.0 |
| Energy Bandgap (eV) | 6.05 | 5.85 | 5.96 |

Referring to [Table 1], it may be seen that the refractive index of the amorphous boron nitride film (a-BN) with respect to light of a wavelength of 633 nm is lower than the refractive indexes of the crystalline boron nitride film (h-BN) and the nanocrystalline boron nitride film (nc-BN). The refractive index of the amorphous boron nitride film (a-BN) may be almost similar to the refractive index of air. Furthermore, it may be seen that the amorphous boron nitride film (a-BN) has excellent mechanical inertness because the amorphous boron nitride film (a-BN) has a density greater than the crystalline boron nitride film (h-BN). The amorphous boron nitride film has a dielectric constant less than the crystalline boron nitride film (h-BN) and the nanocrystalline boron nitride film (nc-BN).

It may be seen that the hexagonal boron nitride film (h-BN) has an energy band gap of about 6.05 eV, the amorphous boron nitride film (a-BN) has an energy band gap of about 5.96 eV, and the nanocrystalline boron nitride film (nc-BN) has an energy band gap of about 5.85 eV. In other words, the amorphous boron nitride film (a-BN) and the nanocrystalline boron nitride film (nc-BN) have an energy bandgap lower than the hexagonal boron nitride film (h-BN). Accordingly, it may be seen that the amorphous boron nitride film (a-BN) is chemically stable.

[Table 2] below shows an example test result of comparing the characteristics of $SiO_2$, a low refractive index polymer (low RI polymer), $MgF_2$, and the amorphous boron nitride film (a-BN).

TABLE 2

|  | $SiO_2$ | Low RI Polymer | $MgF_2$ | a-BN |
| --- | --- | --- | --- | --- |
| Refractive Index @ 622 nm | 1.46 | 1.4~1.7 | 1.37 | 1.37 |
| Density (g/cm$^3$) | 2.2 | ~1 | 3.1 | 2.1~2.3 |
| Hardness (GPa) | 3.5 | <0.1 | — | 11.3 |

Referring to [Table 2], the amorphous boron nitride film (a-BN) has a refractive index lower than $SiO_2$ and the low refractive index polymer. Furthermore, it may be seen that the amorphous boron nitride film (a-BN) has excellent mechanical inertness because the amorphous boron nitride film (a-BN) has a density greater than the low refractive index polymer and a hardness greater than $SiO_2$ and the low refractive index polymer. Although $MgF_2$ has a low refractive index and a high density, a passivation film is needed due to oxidation and low chemical inertness.

As described above, it may be seen that the amorphous boron nitride film (a-BN) has excellent mechanical inertness because the amorphous boron nitride film (a-BN) has a low refractive index similar to air and high density and high hardness. Furthermore, the amorphous boron nitride film (a-BN) has excellent adhesion to another layer and also has excellent thermal and chemical inertness. The amorphous boron nitride film (a-BN) has a high transmittance to light in a visible light range in an ultraviolet range, and also has excellent diffusion barrier characteristics. As the amorphous boron nitride film (a-BN) may have a surface roughness of about 0.5 rms or less, the surface of the amorphous boron nitride film (a-BN) may be very uniformly formed.

In the following description, an analysis result of the measured characteristics of the amorphous boron nitride film (a-BN) according to an embodiment is described in detail. In the following drawings, "a-BN" denotes a measurement result of an amorphous boron nitride film formed at a process temperature of 400° C. by inductively coupled plasma chemical vapor deposition (ICP-CVD), and "nc-BN" denotes a measurement result of a nanocrystalline boron nitride film formed at a process temperature of 700° C. by ICP-CVD.

Figure 3A:
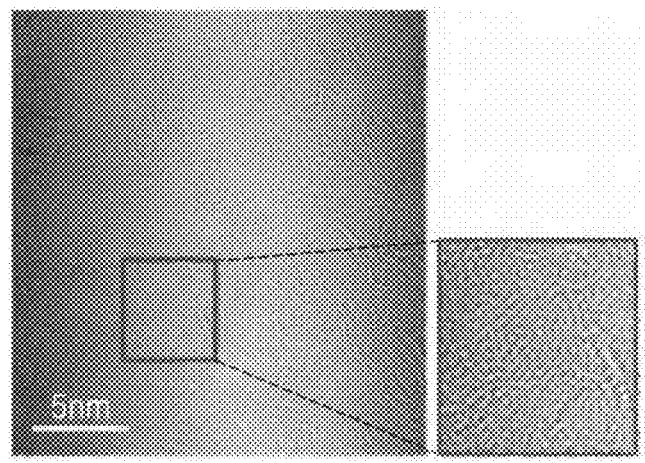
FIGS. 3A and 3B, respectively, are views of a transmission electron microscope (TEM) image and a diffraction pattern of an amorphous boron nitride film, according to a TEM analysis result.
Figure 3B:
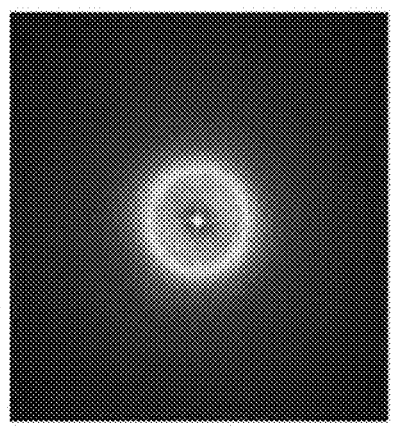

FIGS. 3A and 3B respectively illustrate a transmission electron microscope (TEM) image and a diffraction pattern of the amorphous boron nitride film (a-BN) according to a TEM analysis result. It may be seen from the TEM image of FIG. 3A that atoms constituting the amorphous boron nitride film (a-BN) are arranged in disorder, and that the diffraction pattern of FIG. 3B is a typical diffusion diffraction pattern of an amorphous film.

Figure 4A:
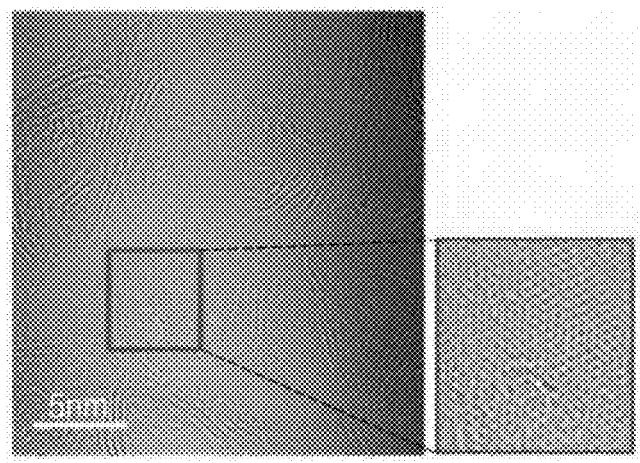
FIGS. 4A and 4B, respectively, are views of a TEM image and a diffraction pattern of a nanocrystalline boron nitride film, according to a TEM analysis result.
Figure 4B:
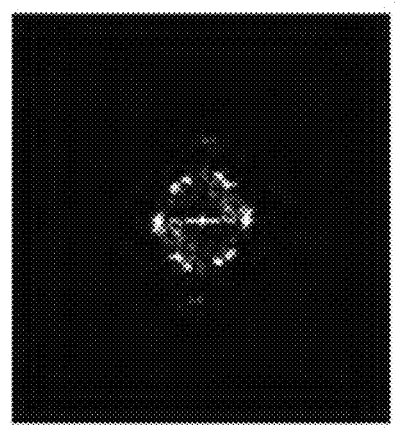

FIGS. 4A and 4B are views of a TEM image and a diffraction pattern of the nanocrystalline boron nitride film (nc-BN), according to a TEM analysis result. It may be seen from the result of FIGS. 4A and 4B that crystal grains having a nano size are arranged in the nanocrystalline boron nitride film (nc-BN). Accordingly, it may be seen that the nanocrystalline boron nitride film (nc-BN) may be formed at a process temperature of 700° C. that is higher than 400° C.

Figure 5:
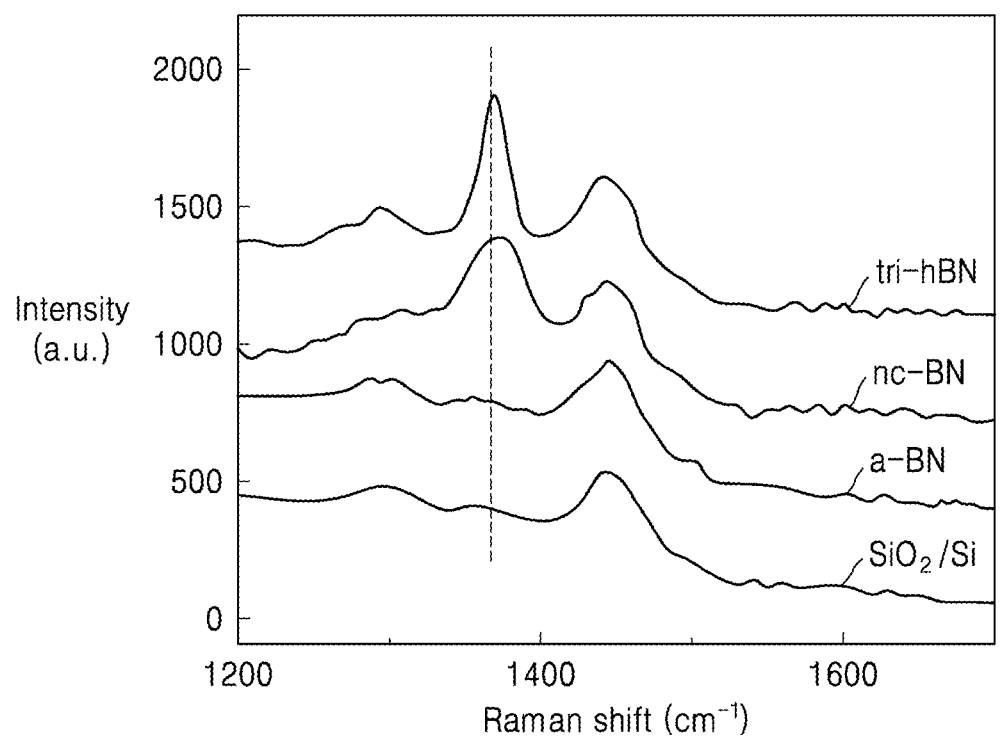
FIG. 5 are views of the Raman spectrums of a crystalline boron nitride film, a nanocrystalline boron nitride film, and an amorphous boron nitride film.

FIG. 5 are views of the Raman spectrums of the crystalline boron nitride film (h-BN), the nanocrystalline boron nitride film (nc-BN), and the amorphous boron nitride film (a-BN). In FIG. 5, "SiO$_2$/Si" denotes a Raman spectrum with respect to a SiO$_2$/Si substrate, and "a-BN" denotes a Raman spectrum measured after the amorphous boron nitride film (a-BN) is formed on the SiO$_2$/Si substrate at a process temperature of 400° C. "nc-BN" denotes a Raman spectrum measured after the nanocrystalline boron nitride film (nc-BN) is formed on the SiO$_2$/Si substrate at a process temperature of 700° C., and "Tri-BN" denotes a Raman spectrum measured after a hexagonal boron nitride film (h-BN) of three layers is epitaxially grown on the SiO$_2$/Si substrate.

Referring to FIG. 5, it may be seen that, in the Raman spectrum with respect to the hexagonal boron nitride film (h-BN) and the Raman spectrum with respect to the nanocrystalline boron nitride film (nc-BN), there is a peak at about 1370 cm$^{-1}$, and thus, the nanocrystalline boron nitride film (nc-BN) has crystallinity. In contrast, it may be seen that the there is no peak in the Raman spectrum with respect to the amorphous boron nitride film (a-BN), and thus, the amorphous boron nitride film (a-BN) has no crystallinity.

Figure 6:
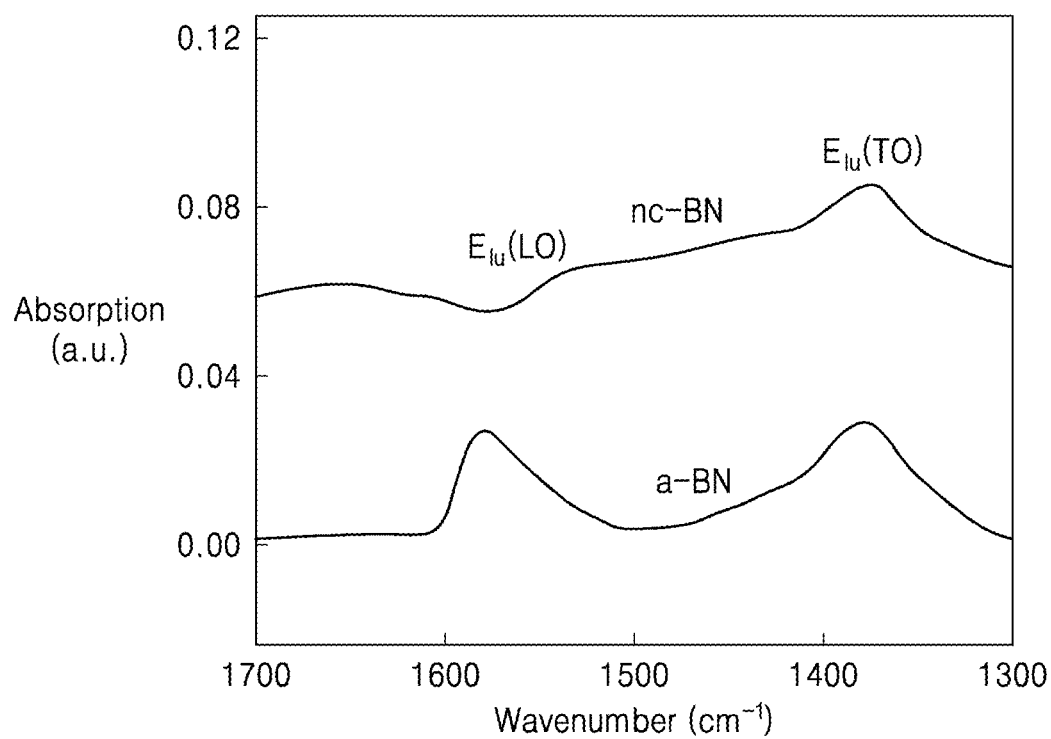
FIG. 6 is a view of Fourier-transform infrared spectroscopy (FT-IR) spectrums with respect to the amorphous boron nitride film and the nanocrystalline boron nitride film.

FIG. 6 is a view of a Fourier-transform infrared spectroscopy (FT-IR) spectrum with respect to the amorphous boron nitride film (a-BN) and the nanocrystalline boron nitride film (nc-BN). FIG. 6 illustrates an FT-IR spectrum that is measured at an incident angle 60° using s-polarized light.

Referring to FIG. 6, it may be seen that, in the FT-IR spectrum with respect to the amorphous boron nitride film (a-BN), there is an absorption peak due to a traverse optical mode at around 1370 cm$^{-1}$, and there is another absorption peak at around 1570 cm$^{-1}$. This means that the amorphous boron nitride film (a-BN) has amorphous characteristics.

It may be seen that, in the FT-IR spectrum with respect to the nanocrystalline boron nitride film (nc-BN), there is an absorption peak due to a traverse optical mode at around 1370 cm$^{-1}$, but there is no absorption peak at around 1570 cm$^{-1}$. This means that the nanocrystalline boron nitride film (nc-BN) has no amorphous characteristics.

Figure 7A:
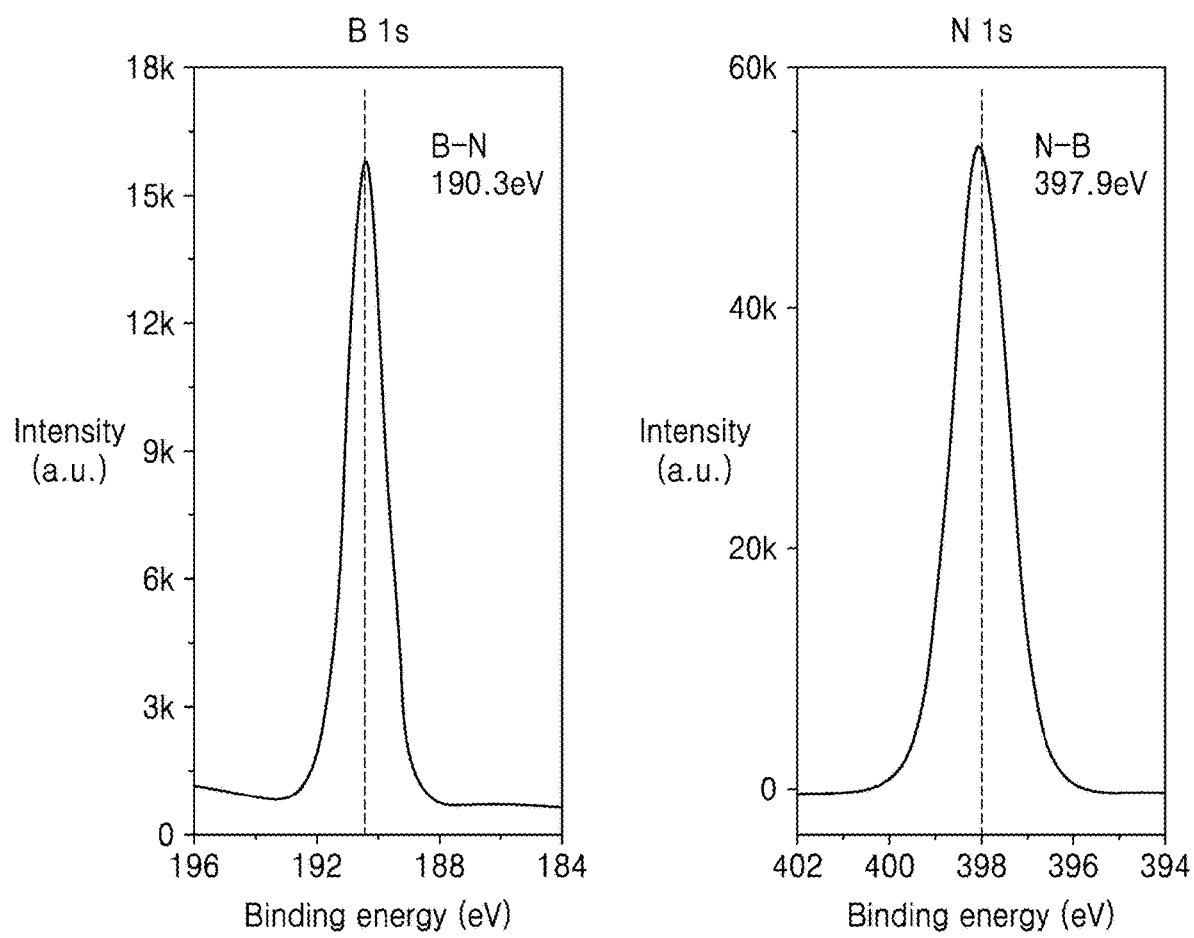
FIGS. 7A and 7B, respectively, are views of X-ray photoelectron spectroscopy (XPS) profiles with respect to the amorphous boron nitride film and the nanocrystalline boron nitride film.
Figure 7B:
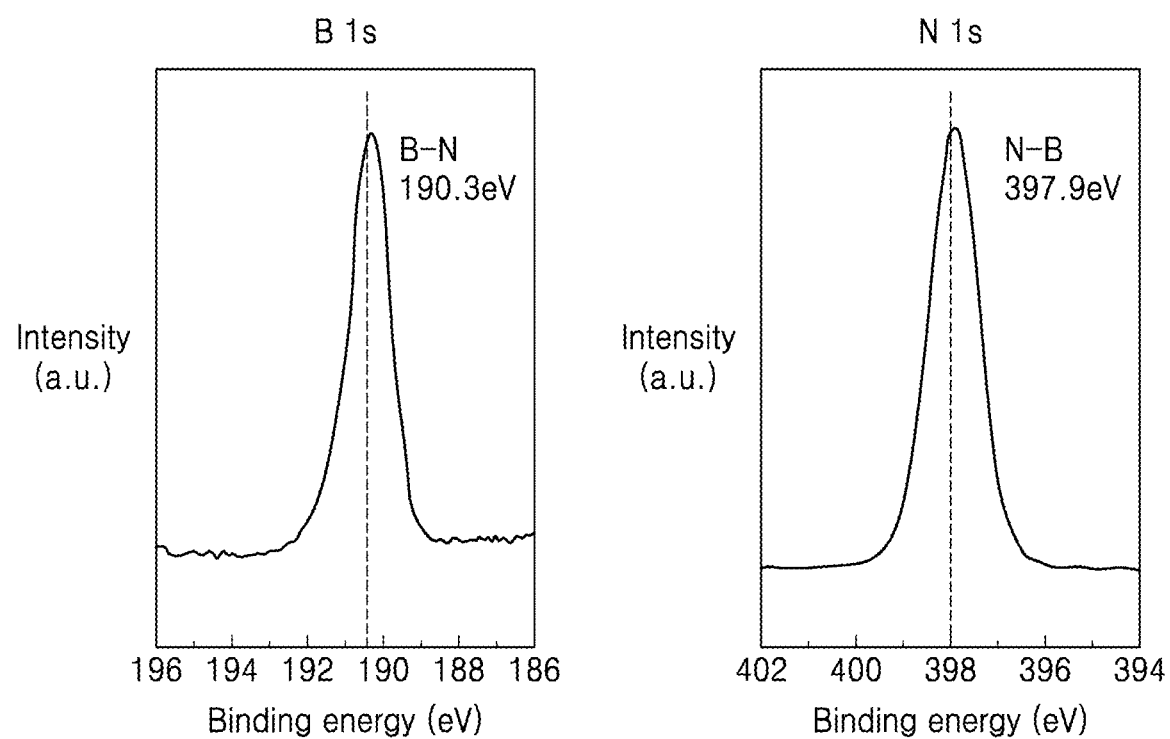

FIG. 7A illustrates an X-ray photoelectron spectroscopy (XPS) profile with respect to the amorphous boron nitride film (a-BN). FIG. 7B illustrates an XPS profile with respect to the nanocrystalline boron nitride film (nc-BN).

It may be seen that, in the XPS profile of FIG. 7A, a peak with respect to 1 s of boron is 190.4 eV, and a peak with respect to 1 s of nitrogen is 397.9 eV. It may be seen that an atomic ratio of boron and nitrogen in the amorphous boron nitride film (a-BN) is about 1:1.08 based on the peak size of boron and nitrogen. The amorphous boron nitride film (a-BN) may include an sp$^3$ hybrid bond and an sp$^2$ hybrid bond, in which a ratio of the sp$^3$ hybrid bond in the amorphous boron nitride film may be less than about 20%.

It may be seen that, in the XPS profile of FIG. 7B, a peak with respect to 1 s of boron is 190.4 eV, and a peak with respect to 1 s of nitrogen is 397.9 eV. It may be seen that the peak with respect to 1 s of boron and the peak with respect to 1 s of nitrogen in the nanocrystalline boron nitride film (nc-BN) almost match a peak with respect to 1 s of boron and a peak with respect to 1 s of nitrogen in the amorphous boron nitride film (a-BN). Accordingly, it may be seen that the atomic ratio of boron and nitrogen in the nanocrystalline boron nitride film (nc-BN) is about 1:1.08

Figure 8:
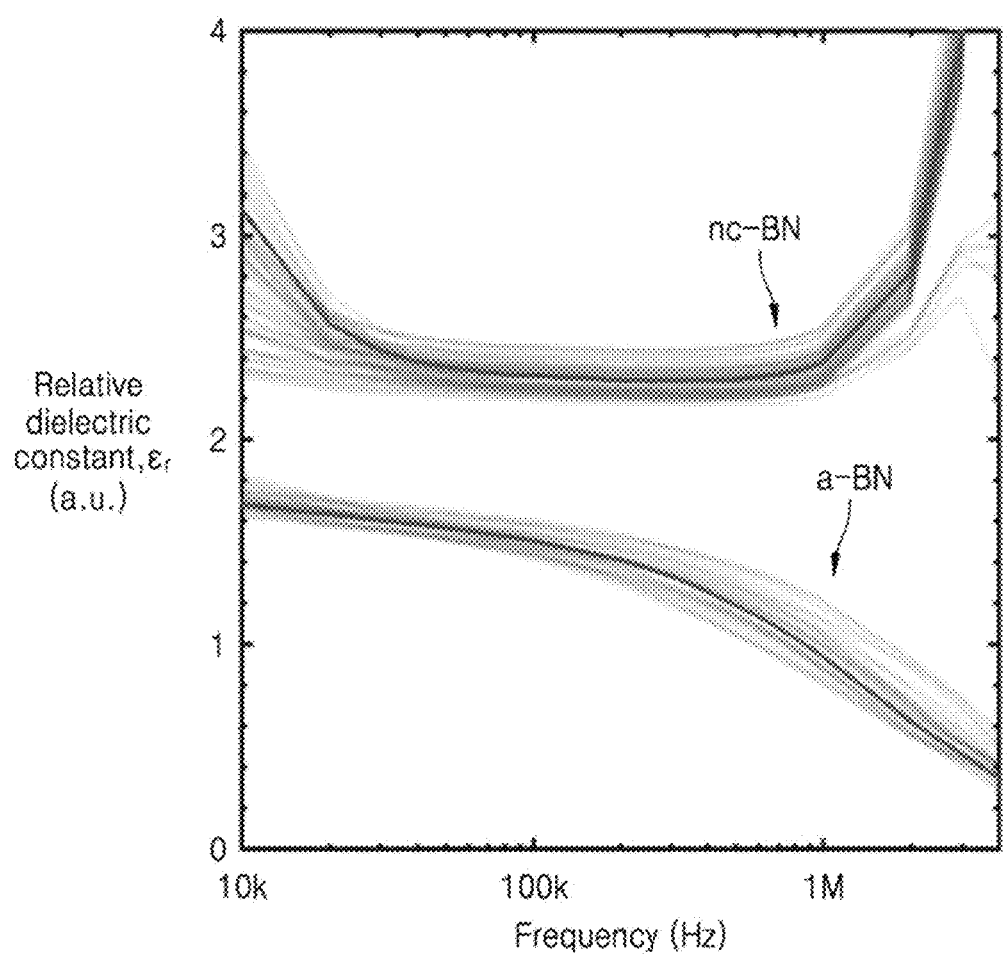
FIG. 8 is a view of a result of measurement of dielectric constants of the amorphous boron nitride film and the nanocrystalline boron nitride film.

FIG. 8 is a view of a result of measurement of dielectric constants of the amorphous boron nitride film (a-BN) and the nanocrystalline boron nitride film (nc-BN). FIG. 8 illustrates results of measurements of a dielectric constant 50 times or more, and a thick line denotes an average dielectric constant.

Referring to FIG. 8, the dielectric constant of the amorphous boron nitride film (a-BN) is inversely proportional to an operating frequency. It may be seen that an average dielectric constant of the amorphous boron nitride film (a-BN) at an operating frequency of 100 kHz is about 1.78. It may be seen that, at an operating frequency of 1 MHz, the average dielectric constant of the amorphous boron nitride film (a-BN) is about 1.16, which is close to the dielectric constant of air or vacuum. As such, a low dielectric constant of the amorphous boron nitride film (a-BN) is caused by a nonpolar bonding between a boron atom and a nitrogen atom. A dielectric constant may be further lowered by forming pores in the amorphous boron nitride film (a-BN).

It may be seen that the average dielectric constant of the nanocrystalline boron nitride film (nc-BN) is about 2.5 or less in an operating frequency range of about 50 kHz to about 1 MHz. For example, the average dielectric constant of the nanocrystalline boron nitride film (nc-BN) may be about 2.3 to about 2.5. The average dielectric constant of the hexagonal boron nitride film (h-BN) is measured to be about 2.9 to about 3.8 at an operating frequency range of about 50 kHz to about 1 MHz.

Figure 9:
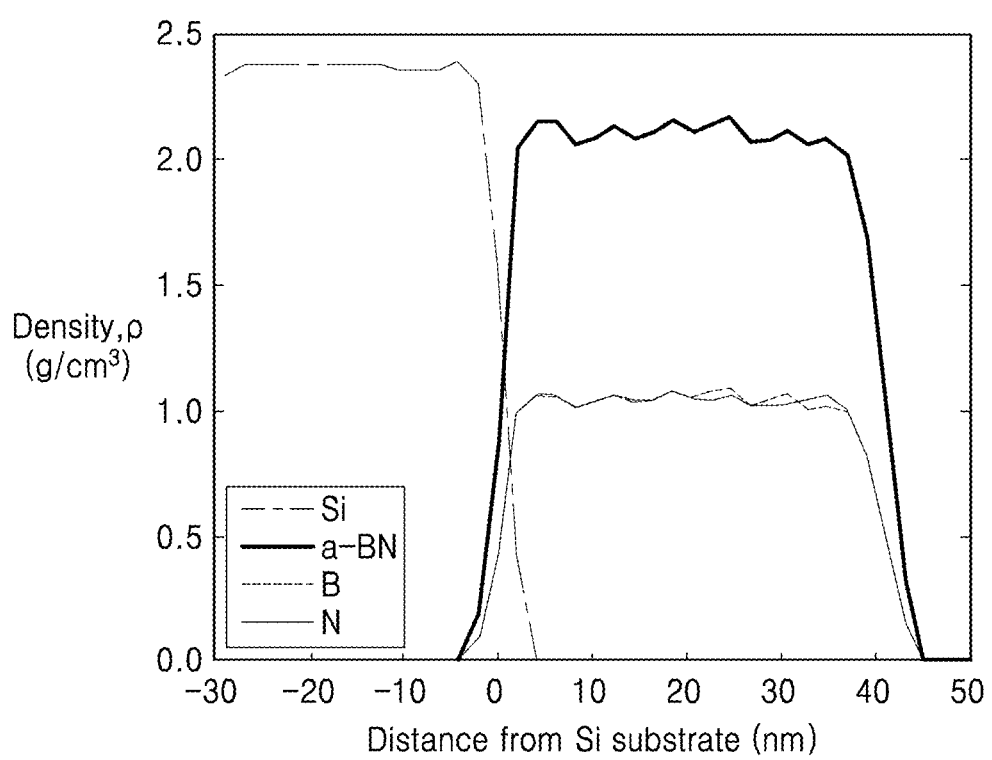
FIG. 9 is a view of a result of simulation of density of the amorphous boron nitride film.

FIG. 9 is a view of a result of simulation of the density of the amorphous boron nitride film (a-BN). After the amorphous boron nitride film (a-BN) having a thickness of 40 nm is grown on a Si substrate, a mass density according to a thickness direction of the amorphous boron nitride film (a-BN) is simulated on the Si substrate.

Referring to FIG. 9, it may be seen that the mass density of the amorphous boron nitride film (a-BN) is about 2 g/cm$^3$. As described below, it may be seen that, although the dielectric constant of the amorphous boron nitride film (a-BN) is low, the density thereof is high so that a mechanical strength thereof is not lowered.

Figure 10:
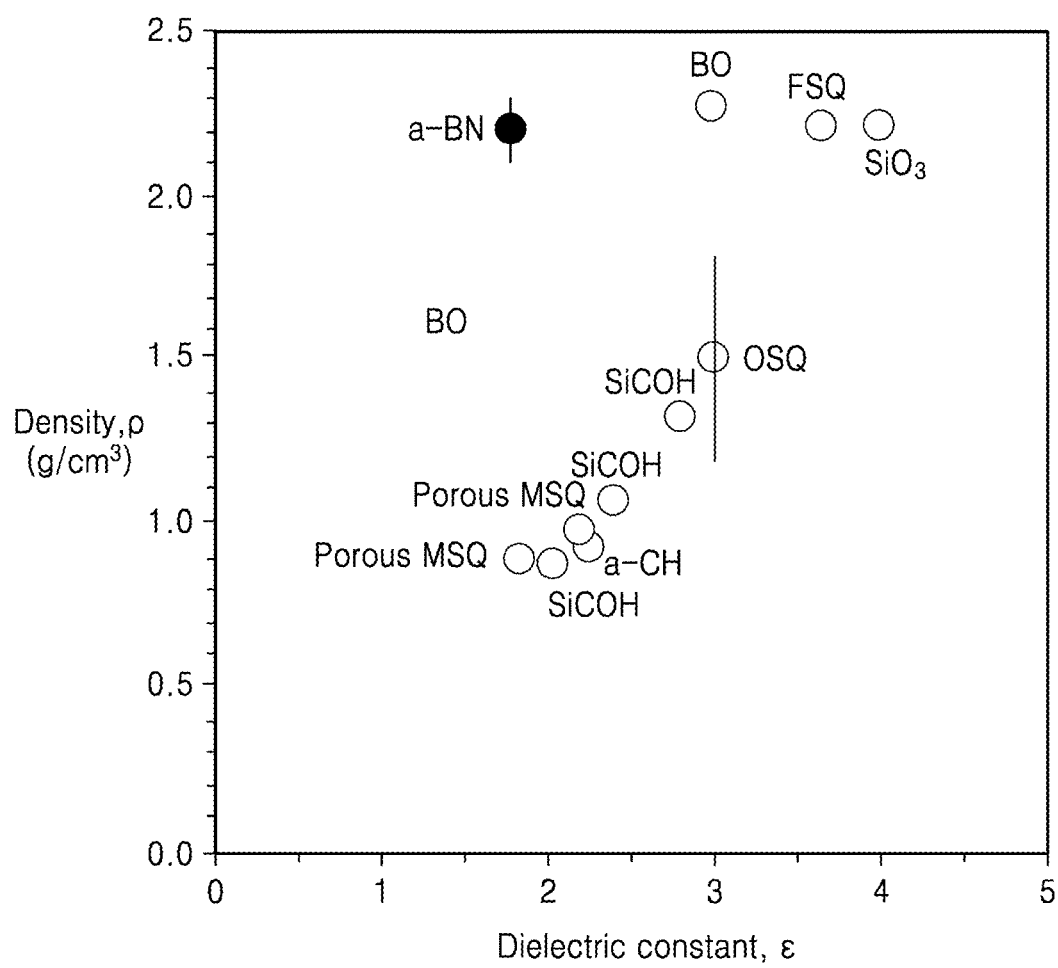
FIG. 10 is a graph of a relationship between a dielectric constant and a density in various materials.

FIG. 10 is a graph of a relationship between a dielectric constant and a density in various materials.

Referring to FIG. 10, the dielectric constant and density of most materials are proportional to each other. Accordingly, in general, as a material having a low dielectric constant has a low density, a mechanical strength thereof may be low. However, the amorphous boron nitride film (a-BN) has a density of about 2 g/cm$^3$ when the dielectric constant thereof is about 2. Thus, the amorphous boron nitride film (a-BN) may have a high mechanical strength because the density of the amorphous boron nitride film (a-BN) is relatively high compared to other materials.

Figure 11:
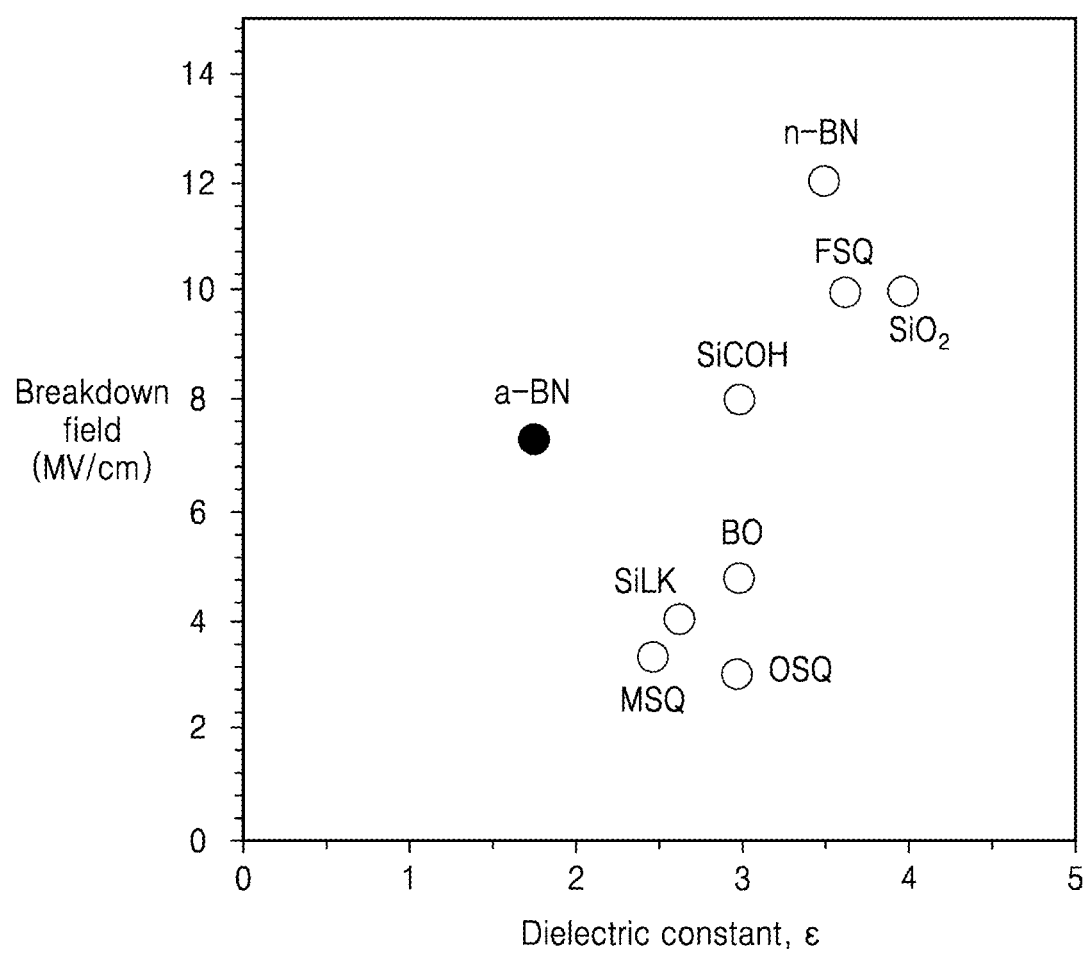
FIG. 11 is a graph of a relationship between a dielectric constant and a breakdown field in various materials.

FIG. 11 is a graph of a relationship between a dielectric constant and a breakdown field in various materials.

Referring to FIG. 11, it may be seen that the dielectric constant and the breakdown field is proportional to each other. It may be seen that, compared to other materials having a dielectric constant close to 2, the breakdown field of the amorphous boron nitride film (a-BN) is higher than the other materials.

[Table 3] below shows an example test result of measuring the dielectric constants and breakdown fields of the amorphous boron nitride film (a-BN) and the hexagonal boron nitride film (h-BN).

TABLE 3

|  | Dielectric Constant @ 100 kHz/@ 1 MHz | Breakdown Field (MV/cm) |
|---|---|---|
| h-BN | 3.28/2.87 | 2.2 |
| a-BN | 1.78/1.16 | 7.3 |

Referring to [Table 3], it may be seen that, as the dielectric constant of the amorphous boron nitride film (a-BN) is less than or equal to 2 at operating frequencies of about 100 kHz and about 1 MHz, the dielectric constant of the amorphous boron nitride film (a-BN) is less than the dielectric constant of the hexagonal boron nitride film (h-BN). Furthermore, it may be seen that, as the breakdown field of the amorphous boron nitride film (a-BN) is about 7.3 MV/cm, the breakdown field of the amorphous boron nitride film (a-BN) is much greater than the breakdown field of the hexagonal boron nitride film (h-BN).

Figure 12:
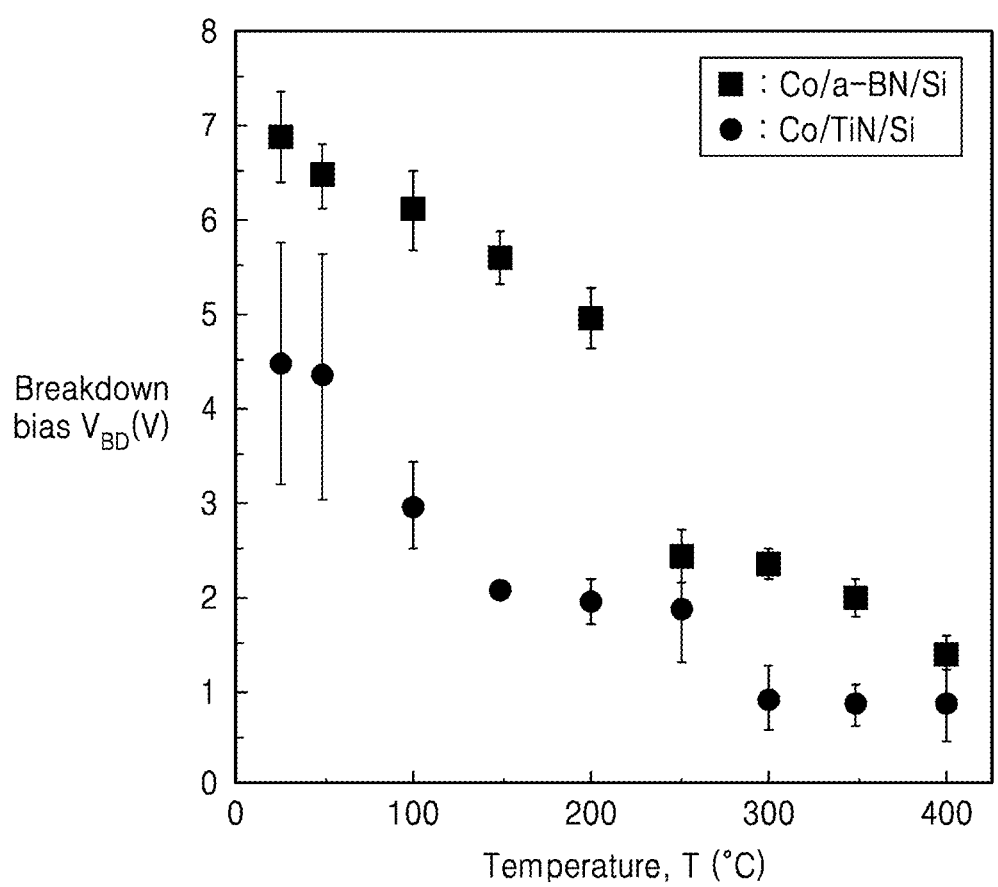
FIG. 12 is a graph of a breakdown bias according to a temperature of the amorphous boron nitride film.

FIG. 12 is a graph of a breakdown bias according to the temperature of the amorphous boron nitride film (a-BN). In FIG. 12, "Co/a-BN/Si" denotes a case in which the amorphous boron nitride film (a-BN) and a Co layer are sequentially deposited on a Si substrate, and "Co/Ti/Si" denotes a case in which a Ti layer and a Co layer are sequentially deposited on a Si substrate.

Referring to FIG. 12, it may be seen that the breakdown bias of the amorphous boron nitride film (a-BN) is inversely proportional to a temperature. It may be seen that, even when the breakdown voltage decreases as the temperature increases, the breakdown bias of the amorphous boron nitride film (a-BN) is greater than the breakdown bias of the TiN layer. This means that the amorphous boron nitride film (a-BN) is stable at various temperatures.

Figure 13:
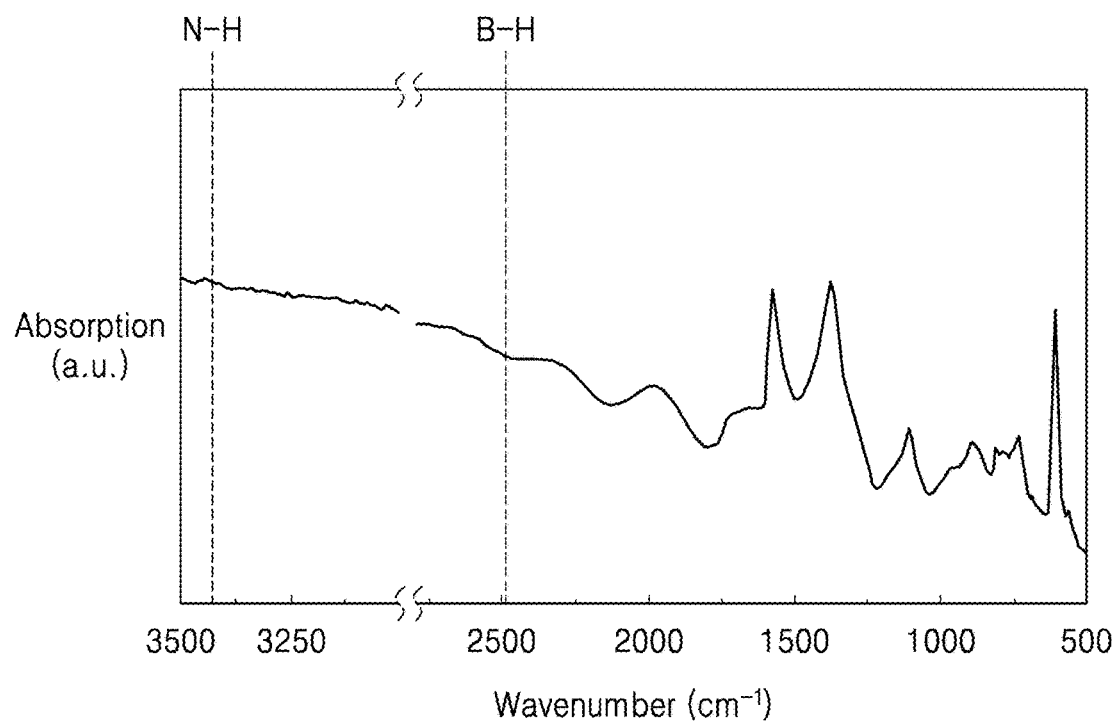
FIG. 13 is a view of an FT-IR spectrum with respect to the amorphous boron nitride film.

FIG. 13 is a view of an FT-IR spectrum with respect to the amorphous boron nitride film (a-BN). Referring to FIG. 13, it may be seen that there is no bond related to hydrogen in an FT-IR spectrum with respect to the amorphous boron nitride film (a-BN) because a peak is not observed in a wavenumber corresponding to a B—H bond and an N—H bond.

Figure 14A:
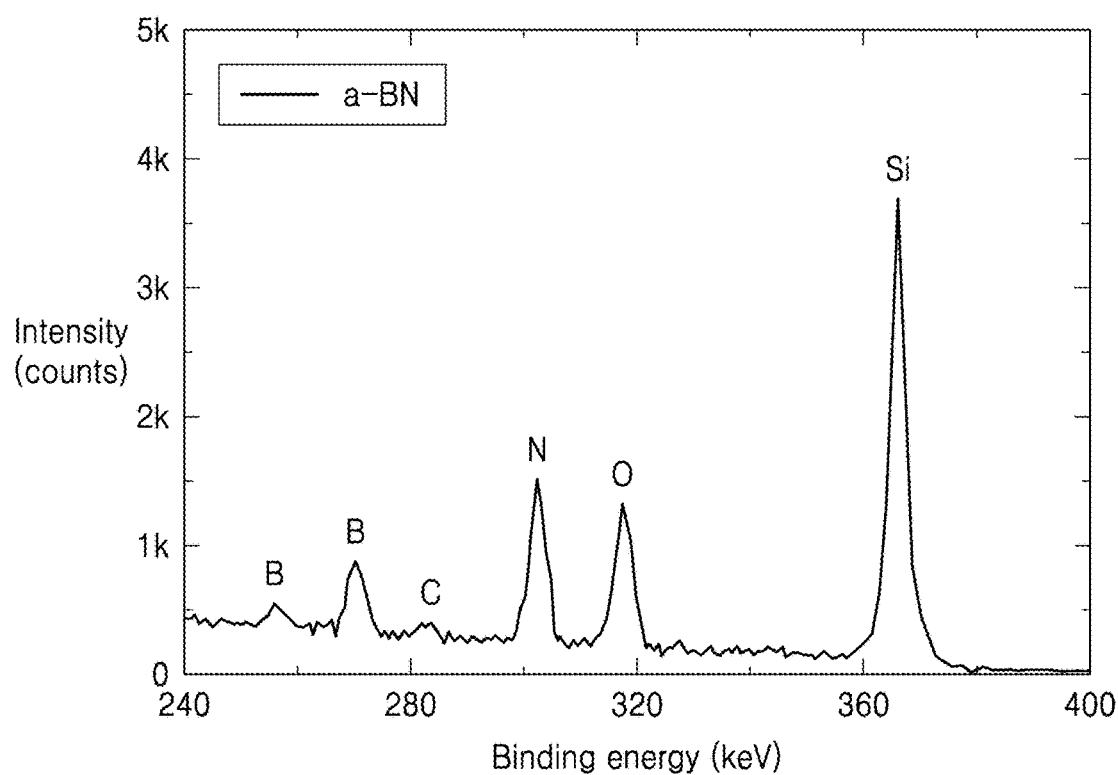
FIG. 14A is a view of an analysis result of a high resolution Rutherford backscattering spectroscopy (HR-RBS) of the amorphous boron nitride film.
Figure 14B:
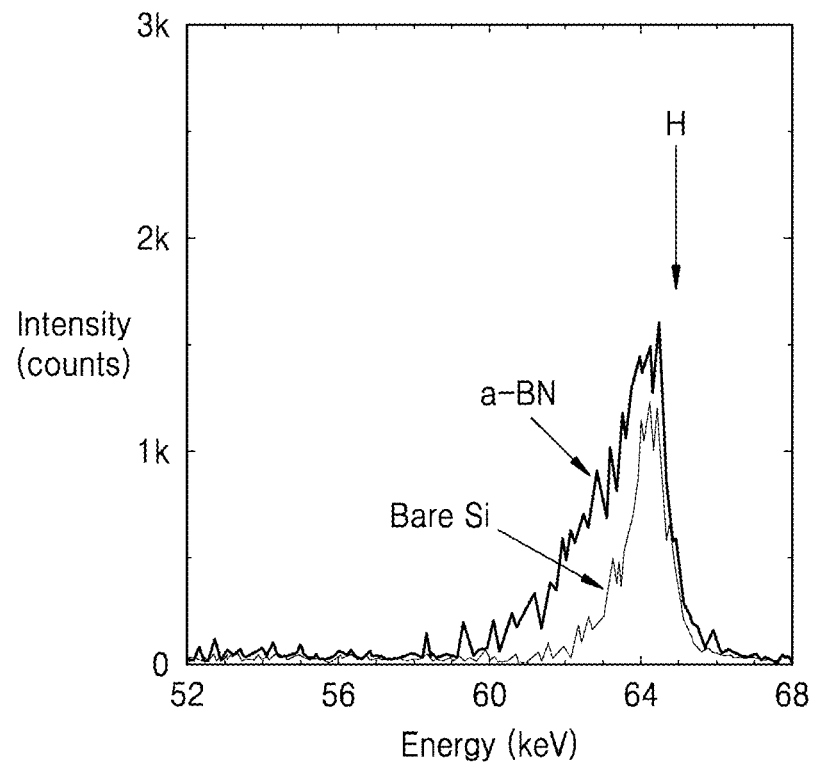
FIG. 14B is a view of an analysis result of high resolution elastic recoil detection analysis (HR-ERDA) of the amorphous boron nitride film.

FIG. 14A is a view of an analysis result of a high resolution Rutherford backscattering spectroscopy (HR-RBS) of the amorphous boron nitride film (a-BN). FIG. 14B is a view of an analysis result of high resolution elastic recoil detection analysis (HR-ERDA) of the amorphous boron nitride film (a-BN).

FIG. 14A illustrates a result of a measurement in a binding energy range of about 240 keV to about 400 keV, and FIG. 14B illustrates a result of a measurement in a binding energy range of about 52 keV to about 68 keV. Referring to FIGS. 14A and 14B, it may be seen that Si and O that are elements of a substrate are measured, and B and N that are elements of the amorphous boron nitride film (a-BN) are measured. Furthermore, it may be seen that hydrogen is also measured.

[Table 4] below shows a composition ratio of the amorphous boron nitride film (a-BN) calculated using the measurement results illustrated in FIGS. 14A and 14B.

TABLE 4

|  | B (at %) | N (at %) | H (at %) |
|---|---|---|---|
| a-BN | 47.6 | 46.9 | 5.5 |

Referring to [Table 4], it may be seen that a ratio of boron and nitrogen is about 1.04:1. Furthermore, it may be seen that a hydrogen content in the amorphous boron nitride film (a-BN) is about 5.5 at %.

Figure 15:
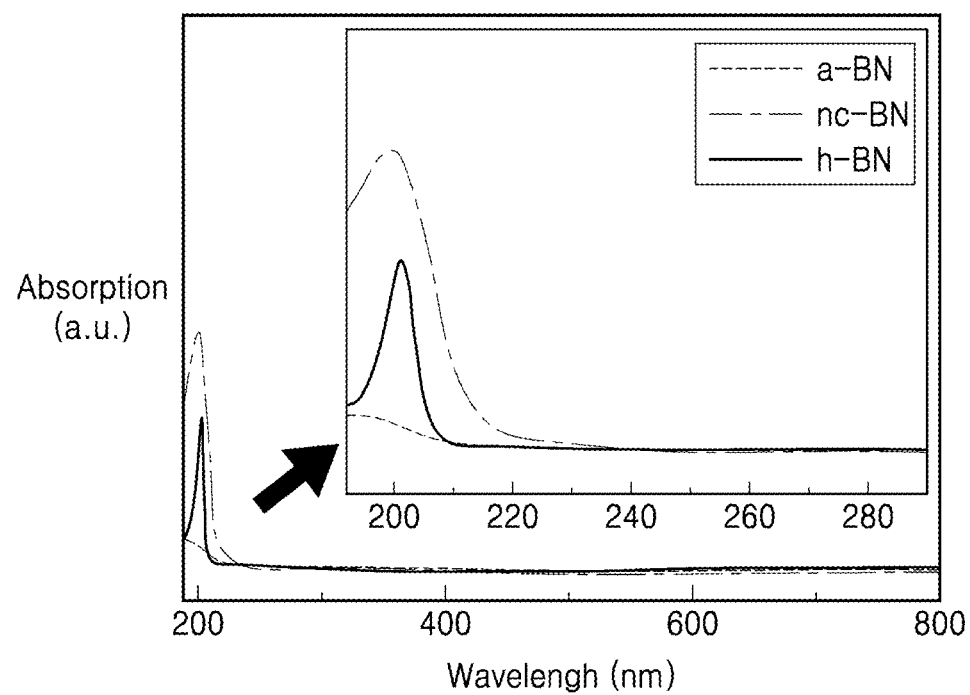
FIG. 15 is a view of an absorption of the crystalline boron nitride film, the nanocrystalline boron nitride film, and the amorphous boron nitride film, according to a light wavelength.

FIG. 15 is a view of an absorption of the crystalline boron nitride film (h-BN), the nanocrystalline boron nitride film (nc-BN), and the amorphous boron nitride film (a-BN), according to a light wavelength. FIG. 15 illustrates an absorption with respect to light in an ultraviolet wavelength range.

Referring to FIG. 15, it may be seen that, while the crystalline boron nitride film (h-BN) and the nanocrystalline boron nitride film (nc-BN) each have a high absorption with respect to light in a wavelength range of about 100 nm, the amorphous boron nitride film (a-BN) shows a high transmittance due to a low absorption for the light in a wavelength range of about 100 nm.

Figure 16:
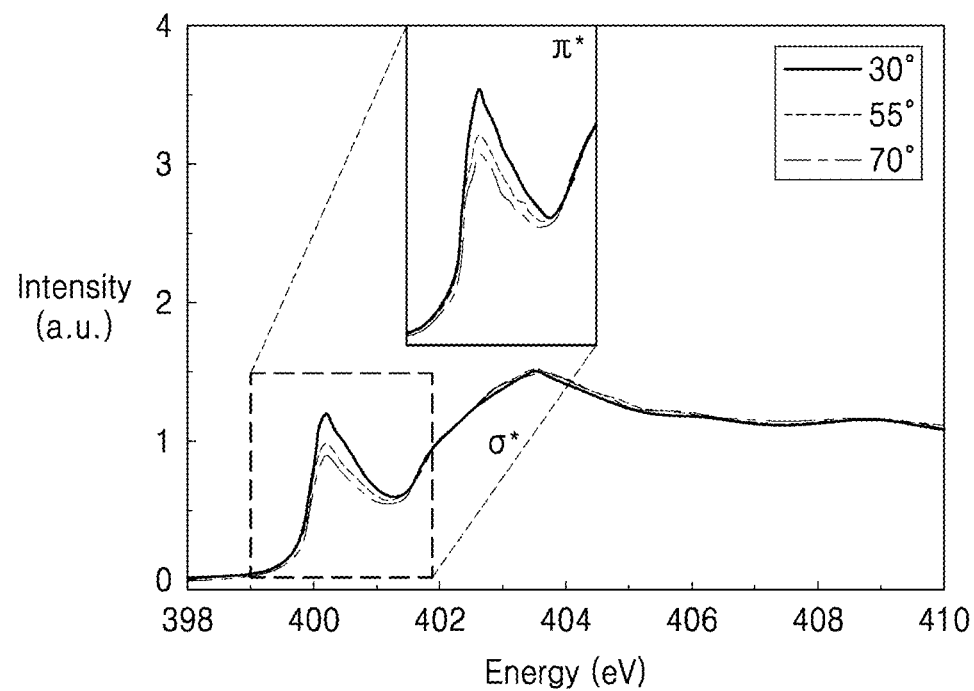
FIG. 16 is a view of an analysis result of a near edge X-ray absorption fine structure (NEXAFS) of the amorphous boron nitride film.

FIG. 16 is a view of an analysis result of a near edge X-ray absorption fine structure (NEXAFS) of the amorphous boron nitride film (a-BN). Referring to FIG. 16, it may be seen that B-N planes formed by the $sp^2$ hybrid bond in the amorphous boron nitride film (a-BN) are randomly oriented with arbitrary directions.

Figure 17A:
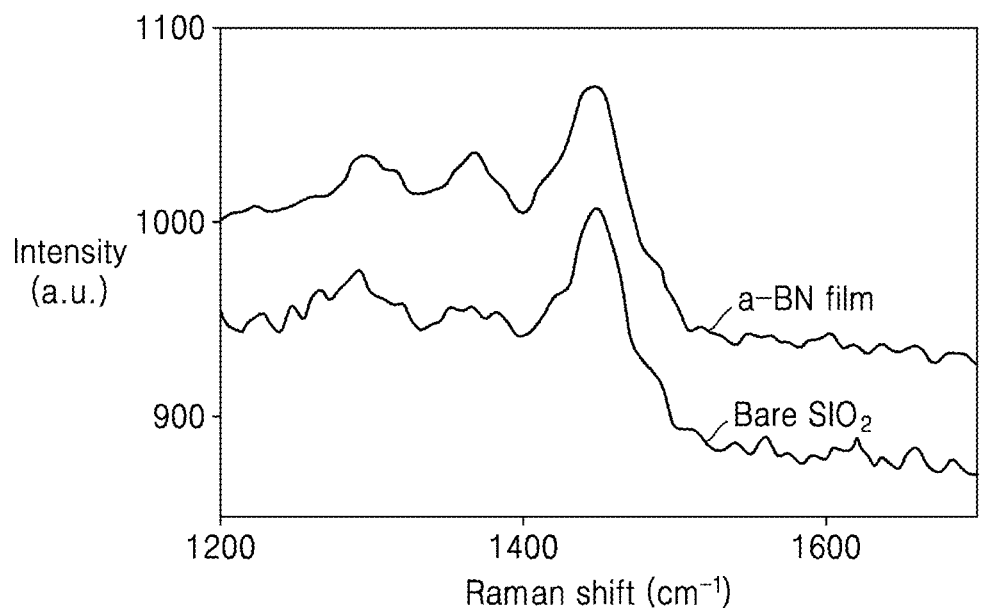
FIGS. 17A and 17B, respectively, are views of the Raman spectrum and an XPS analysis result of the amorphous boron nitride film transferred to a substrate.
Figure 17B:
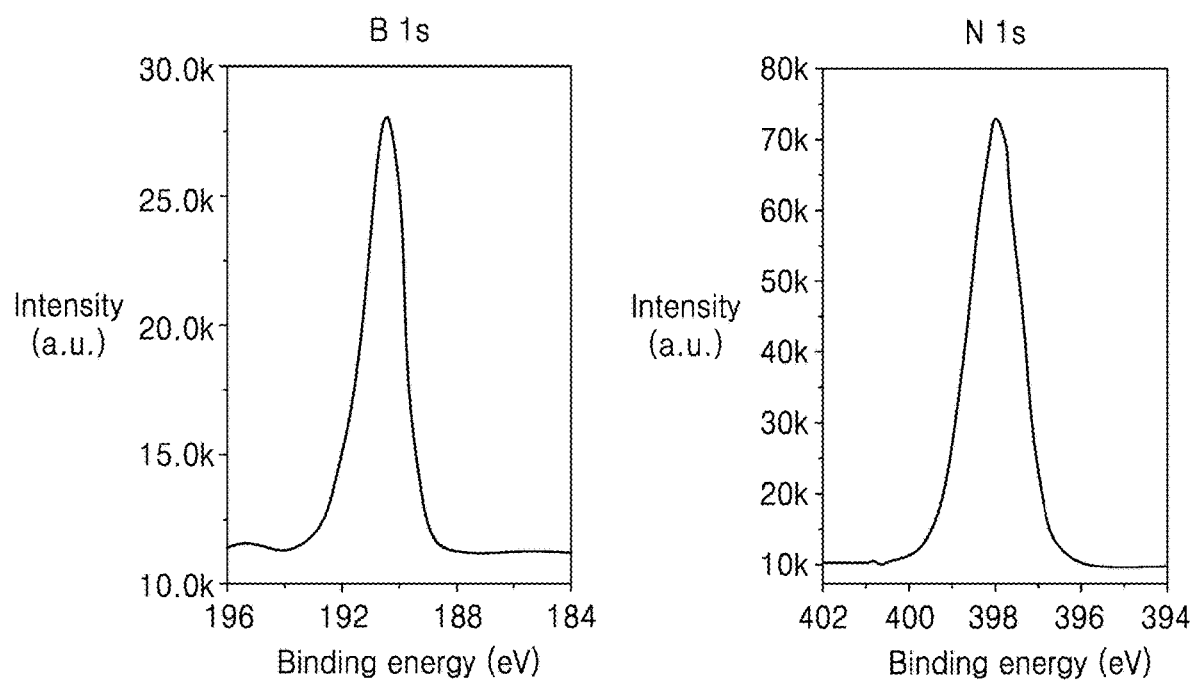

FIGS. 17A and 17B respectively illustrate the Raman spectrum and an XPS image of the amorphous boron nitride film (a-BN), which are transferred to a substrate.

FIG. 17A illustrates the Raman spectrum with respect to the amorphous boron nitride film (a-BN) transferred to an $SiO_2$ substrate. In FIG. 17A, "Bare $SiO_2$" denotes a Raman spectrum with respect to the $SiO_2$ substrate where the amorphous boron nitride film (a-BN) is not grown, and "a-Si film" denotes the Raman spectrum with respect to the amorphous boron nitride film (a-BN) transferred to the $SiO_2$ substrate. The amorphous boron nitride film (a-BN) is grown on a copper foil (Cu foil) at plasma power of about 30 W and a process temperature of about 300° C., and then transferred to the $SiO_2$ substrate. Referring to FIG. 17A, it may be seen that a result of the Raman spectrum with respect to the amorphous boron nitride film (a-BN) transferred to the $SiO_2$ substrate is similar to a result of Raman spectrum with respect to an $SiO_2$ substrate where the amorphous boron nitride film (a-BN) is not grown. It may be seen from the above that the amorphous boron nitride film (a-BN) transferred to the $SiO_2$ has an amorphous structure like the $SiO_2$ substrate.

FIG. 17B is an XPS image of the amorphous boron nitride film (a-BN) transferred to the $SiO_2$. Referring to FIG. 17B, it may be seen that, in the amorphous boron nitride film (a-BN) transferred to the $SiO_2$, like the amorphous boron nitride film (a-BN) grown at a process temperature of 400° C. as described above, a peak with respect to 1 s of boron is about 190.4 eV, and a peak with respect to 1 s of nitrogen is about 397.9 eV. It may be seen from the above that an atomic ratio of boron and nitrogen is about 1:1.08 and there is an $sp^2$ bond based on the peak size of each of boron and nitrogen.

As described above, as the amorphous boron nitride film (a-BN) has a low refractive index and excellent thermal, mechanical and chemical stability, as described below, various devices may be implemented by using the amorphous boron nitride film (a-BN) as an anti-reflection film.

Figure 18:
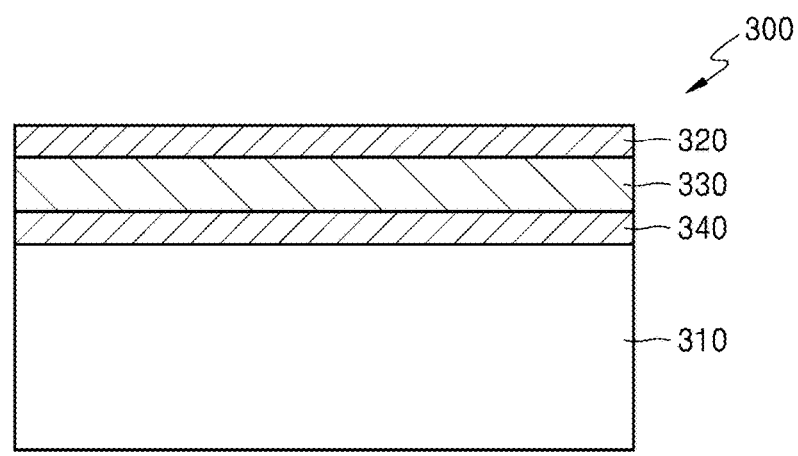
FIG. 18 is a view of an anti-reflection coating structure according to another embodiment.

FIG. 18 is a view of an anti-reflection coating structure 300 according to another embodiment.

Referring to FIG. 18, the anti-reflection coating structure 300 may include a substrate 310, an amorphous boron nitride film 320, a first material layer 330, and a second material layer 340. The first and second material layers 330 and 340 may be provided between the substrate 310 and the amorphous boron nitride film 320. In detail, the second material layer 340 may be provided on an upper surface of the substrate 310, and the first material layer 330 may be provided on an upper surface of the second material layer 340. The amorphous boron nitride film 320 may be provided on an upper surface of the first material layer 330.

The first and second material layers 330 and 340 may include a material having a refractive index greater than the amorphous boron nitride film 320. The first material layer 330 may include a material having a refractive index greater than the second material layer 340.

The amorphous boron nitride film 320 may have a refractive index of about 1.0 to about 1.5 in a wavelength range of about 100 nm to about 1000 nm. The first material layer 330 may have a refractive index of, for example, about 2.0 to about 2.3, and the second material layer 340 may have a refractive index of, for example, about 1.5 to about 1.8. However, the disclosure is not limited thereto.

The first material layer 330 may include, for example, $ZrO_2$, and the second material layer 340 may include, for example, $CeF_3$, $AlO_x$, and the like. However, this is merely examples, and the first and second material layers 330 and 340 each may include other various materials.

The amorphous boron nitride film 320 and the first and second material layers 330 and 340 each may have a thickness to reduce reflectivity. For example, when the center wavelength of light incident on the anti-reflection coating structure 300 is $\lambda$, the amorphous boron nitride film 320 is formed to have a thickness of about $\lambda/4$, the first material layer 330 is formed to have a thickness of about $\lambda/2$, and the second material layer 340 is formed to have a thickness of about $\lambda/4$, thereby reducing reflectivity.

Although a case in which two material layers (330 and 340) are provided between the substrate 310 and the amorphous boron nitride film 320 is described above as an example, the disclosure is not limited thereto, and one material layer or three or more material layers may be provided between the substrate 310 and the amorphous boron nitride film 320.

Figure 19:
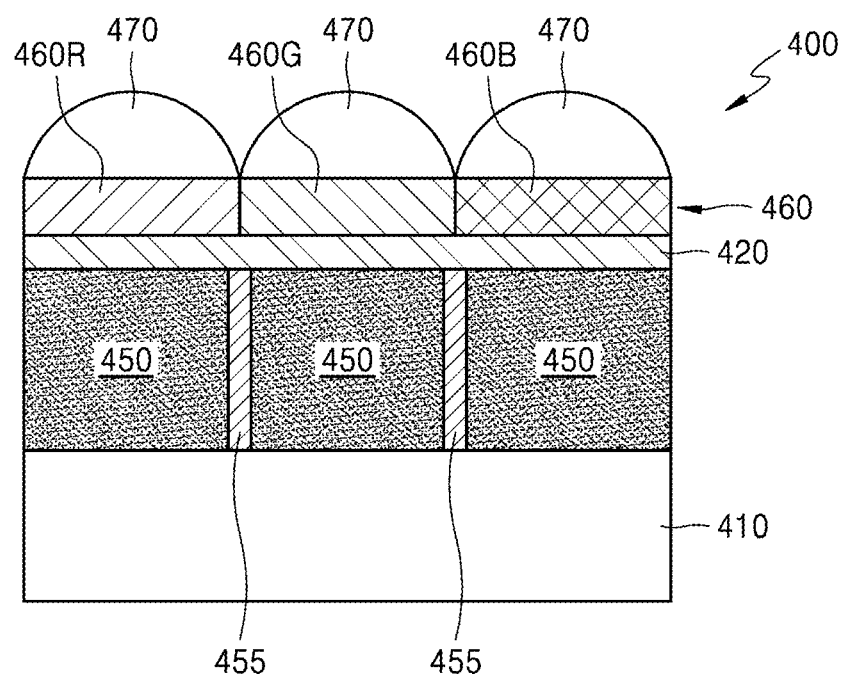
FIG. 19 is a view of an image sensor according to an embodiment.

FIG. 19 is a view of an image sensor 400 according to an embodiment. In FIG. 19, the image sensor 400 may be, for example, a complementary metal-oxide semiconductor (CMOS) image sensor.

Referring to FIG. 19, the image sensor 400 may include a substrate 410, a plurality of photodiodes 450 provided on the substrate 410, an amorphous boron nitride film 420 provided on the photodiodes 450, and a color filter layer 460 provided on the amorphous boron nitride film 420.

The photodiodes 450 corresponding to pixels may be arranged on the substrate 410 in a two-dimensional form. A black matrix 455 may be provided between the photodiodes 450. The photodiodes 450 may convert incident light to electric energy, and a metal wiring (not shown) for detecting electric energy generated from the photodiodes 450 may be provided on the substrate 410. The color filter layer 460 may include a plurality of color filters 460R, 460G, and 460B provided to correspond to the photodiodes 450. The color filters 460R, 460G, and 460B may be, for example, the red color filter 460R, the green color filter 460G, and the blue color filter 460B. However, the disclosure is not limited thereto. A plurality of microlenses 470 corresponding to the color filters 460R, 460G, and 460B may be further provided on the color filter layer 460.

The amorphous boron nitride film 420 may be provided between the color filter layer 460 and the photodiodes 450. The amorphous boron nitride film 420, which limits and/or prevents reflection of light input through the color filter layer 460, may have a low refractive index and a high hardness. As the amorphous boron nitride film 420 is described above, a description thereof is omitted.

As the amorphous boron nitride film 420 is applied to the image sensor 400 as an anti-reflection film, the light concentration ratio of each pixel may be improved, and light interference that may occur between the pixels may also be limited and/or prevented.

Figure 20:
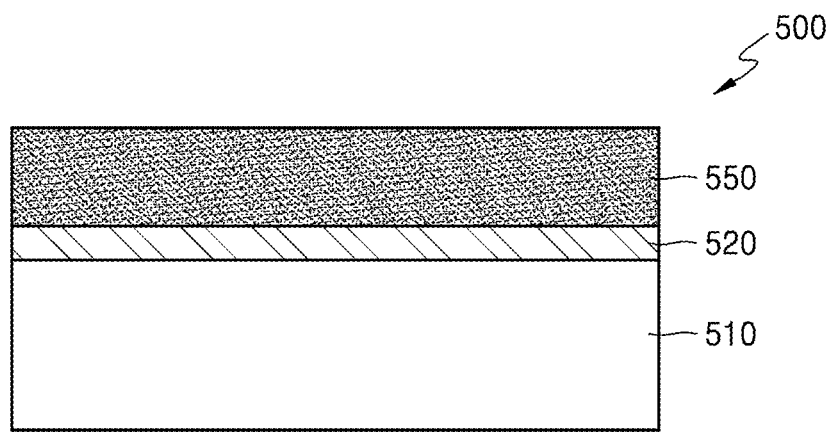
FIG. 20 is a view of a lithographic device according to an embodiment.

FIG. 20 is a lithographic device 500 according to an embodiment.

Referring to FIG. 20, the lithographic device 500 may include a substrate 510, a photoresist layer 550 provided on the substrate 510, and an amorphous boron nitride film 520 provided between the substrate 510 and the photoresist layer 550. The substrate 510 may be a structure to be patterned through a photolithography process.

The amorphous boron nitride film 520 may limit and/or prevent reflection of light transmitted through the photoresist layer 550. As the amorphous boron nitride film 520 is described above, a description thereof is omitted. In the present embodiment, the amorphous boron nitride film 520 may have a relatively uniform surface to limit and/or prevent scattered reflection. For example, the surface of the amorphous boron nitride film 520 may have a surface roughness of about 0.5 rms or less.

In the state illustrated in FIG. 20, when light of a certain wavelength, for example, an ultraviolet ray, is incident on the photoresist layer 550 through a photomask (not shown), the amorphous boron nitride film 520 effectively limits and/or prevents reflection of the light transmitted through the photoresist layer 550, thereby accurately patterning the photoresist layer 550 in a desired shape. When the substrate 510 is etched using the photoresist layer 550 patterned above as an etching mask, a structure in a desired shape may be implemented.

In an extreme ultraviolet (EUV) or deep ultraviolet (DUV) photolithography process for ultra-fine integration, it is a problem that, as the size of a pattern decreases, line edge roughness (LER) or line width roughness (LWR) increases due to light reflection of a substrate to be patterned. In the present embodiment, as the amorphous boron nitride film 520 having a low refractive index and excellent mechanical characteristics is formed as an anti-reflection film between the substrate 510 and the photoresist layer 550, an ultra-fine pattern may be uniformly and precisely implemented.

Figure 21:
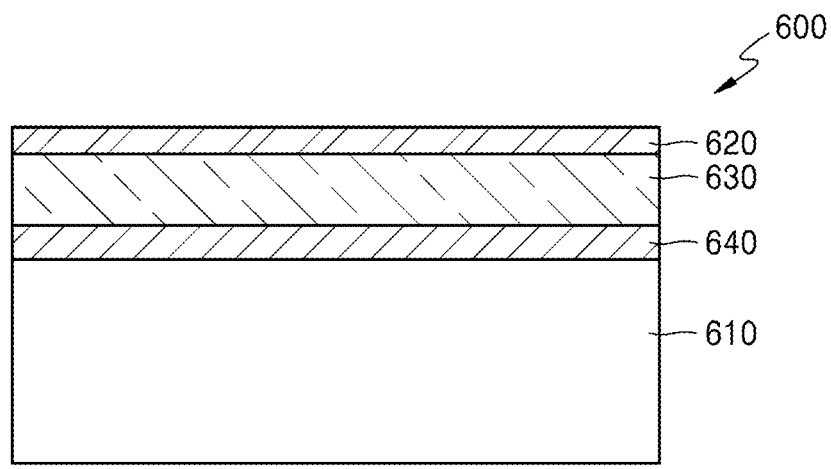
FIG. 21 is a solar cell according to an embodiment.

FIG. 21 is a view of a solar cell 600 according to an embodiment.

Referring to FIG. 21, the solar cell 600 may include a light absorption layer 610 and an amorphous boron nitride film 620 provided on the light absorption layer 610. The light absorption layer 610 may include semiconductor materials that absorb incident light to generate electric energy.

A heat spreading layer 640 for spreading heat generated from the light absorption layer 610 may be further provided between the light absorption layer 610 and the amorphous boron nitride film 620, and a transparent substrate 630 may be further provided between the heat spreading layer 640 and the amorphous boron nitride film 620.

The amorphous boron nitride film 620 may limit and/or prevent reflection of incident light, thereby improving the efficiency of the solar cell 600. As the amorphous boron nitride film 620 is described above, a description thereof is omitted. As such, by forming the amorphous boron nitride film 620 in the solar cell 600, the light incident on the light absorption layer 610 may be increased, and light loss due to reflected light may be reduced.

Figure 22:
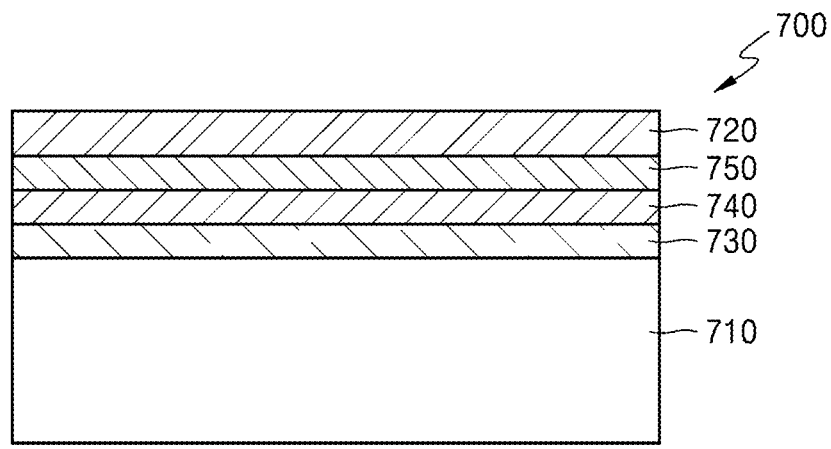
FIG. 22 is a view of a display device according to an embodiment.

FIG. 22 is a view of a display device 700 according to an embodiment.

Referring to FIG. 22, the display device 700 may include a display panel 710 and an amorphous boron nitride film 720 provided on the display panel 710. Although the display panel 710 may include, for example, a liquid crystal display panel, an organic light-emitting display panel, and the like, the disclosure is not limited thereto.

A transparent substrate 730 may be provided on an upper surface of the display panel 710, and a polarizer 740 for increasing a viewing angle may be provided on an upper surface of the transparent substrate 730. Furthermore, a protection film 750 may be provided on an upper surface of the polarizer 740. The amorphous boron nitride film 720 may be provided on an upper surface of the protection film 750 as an anti-reflection film. As the amorphous boron nitride film 720 is described above, a description thereof is omitted.

The protection film 750 may include a material having a higher refractive index than the amorphous boron nitride film 720. In a wavelength range of about 100 nm to about 1000 nm, the amorphous boron nitride film 720 may have a refractive index of about 1.0 to about 1.5. Although the protection film 750 may have a refractive index greater than, for example, about 1.6, the disclosure is not limited thereto.

As such, as the amorphous boron nitride film 720 functioning as an anti-reflection film is provided on the display panel 710, the reflected light reaching the eyes of a person looking at the display device 700 may be reduced.

Cases in which the amorphous boron nitride films 420, 520, 620, and 720 are applied to the image sensor 400, the lithographic device 500, the solar cell 600, and the display device 700, respectively, are described above as examples. However, these are merely examples, and other amorphous boron nitride films may be applied to various other devices requiring anti-reflection.

As described above, according to an embodiment, the amorphous boron nitride film may have excellent characteristics such as a low refractive index, excellent thermal, mechanical and chemical stability, and the like, which are required for an anti-reflection film. The amorphous boron nitride film may be applied to various devices requiring anti-reflection. Although embodiments have been described above, these are merely examples, and those skilled in the art to which the present disclosure pertains may make various modifications and changes from these descriptions.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An amorphous boron nitride film having an amorphous structure, the amorphous structure comprising an $sp^3$ hybrid bond and an $sp^2$ hybrid bond, wherein a ratio of the $sp^3$ hybrid bond in the amorphous boron nitride film is less than about 20%,
   wherein a thickness of the amorphous boron nitride film is ¼ of a center wavelength of light incident on the amorphous boron nitride film.

2. An anti-reflection coating structure comprising:
   a substrate; and
   an amorphous boron nitride film on the substrate and having an amorphous structure, the amorphous structure comprising an $sp^3$ hybrid bond and an $sp^2$ hybrid bond, wherein a ratio of the $sp^3$ hybrid bond in the amorphous boron nitride film is less than about 20%,
   wherein a thickness of the amorphous boron nitride film is ¼ of a center wavelength of light incident on the amorphous boron nitride film.

3. The anti-reflection coating structure of claim 2, wherein a refractive index of the amorphous boron nitride film with respect to light in a wavelength range of about 100 nm to about 1000 nm is about 1.0 to about 1.5.

4. An anti-reflection coating structure comprising:
   a substrate; and
   an amorphous boron nitride film on the substrate and having an amorphous structure, the amorphous structure comprising an $sp^3$ hybrid bond and an $sp^2$ hybrid bond, wherein a ratio of the $sp^3$ hybrid bond in the amorphous boron nitride film is less than about 20%,
   at least one material layer between the substrate and the amorphous boron nitride film.

5. The amorphous boron nitride film of claim 4, wherein a refractive index of the amorphous boron nitride film with respect to light in a wavelength range of about 100 nm to about 1000 nm is about 1.0 to about 1.5.

6. The amorphous boron nitride film of claim 4, wherein a content ratio of boron to nitrogen in the amorphous boron nitride film is about 0.5 to about 2.0.

7. The amorphous boron nitride film of claim 4, wherein a surface roughness of the amorphous boron nitride film is about 0.5 root-mean-square (rms) or less.

8. The amorphous boron nitride film of claim 4, wherein a dielectric constant of the amorphous boron nitride film is about 2.5 or less.

9. The amorphous boron nitride film of claim 4, wherein an energy bandgap of the amorphous boron nitride film is about 6.0 eV or less.

10. The amorphous boron nitride film of claim 4, wherein a density of an amorphous boron nitride film is about 1.8 $g/cm^3$ or more.

11. The amorphous boron nitride film of claim 4, wherein a hydrogen content of the amorphous boron nitride film is less than about 10 at %.

12. The anti-reflection coating structure of claim 4, wherein a thickness of the amorphous boron nitride film is ¼ of a center wavelength of light incident on the amorphous boron nitride film.

13. The anti-reflection coating structure of claim 4, wherein a density of the amorphous boron nitride film is about 1.8 $g/cm^3$ or more.

14. The anti-reflection coating structure of claim 4, wherein the at least one material layer has a refractive index greater than a refractive index of the amorphous boron nitride film.

15. An image sensor comprising:
   a substrate;
   a plurality of photodiodes on the substrate in a two-dimensional form;
   a color filter layer on the plurality of photodiodes; and the amorphous boron nitride film of claim 1 on the plurality of photodiodes.

16. The image sensor of claim 15, wherein the amorphous boron nitride film is between the plurality of photodiodes and the color filter layer.

17. The image sensor of claim 15, wherein a refractive index of the amorphous boron nitride film with respect to light in a wavelength range of about 100 nm to about 1000 nm is about 1.0 to about 1.5.

18. The image sensor of claim 15, further comprising:

a plurality of microlenses on the color filter layer in a two-dimensional form.

19. A lithographic device comprising:

a substrate;

a photoresist layer on the substrate; and the amorphous boron nitride film of claim 1 between the substrate and the photoresist layer.

20. The lithographic device of claim 19, wherein a refractive index of the amorphous boron nitride film with respect to light in a wavelength range of about 100 nm to about 1000 nm is about 1.0 to about 1.5.

21. The lithographic device of claim 19, wherein a surface roughness of the amorphous boron nitride film is about 0.5 root-mean-square (rms) or less.

22. A solar cell comprising:

a light absorption layer that absorbs incident light and generates electric energy; and the amorphous boron nitride film of claim 1 on the light absorption layer.

23. The solar cell of claim 22, wherein a refractive index of the amorphous boron nitride film with respect to light in a wavelength range of about 100 nm to about 1000 nm is about 1.0 to about 1.5.

24. The solar cell of claim 22, further comprising:

a heat spreading layer between the light absorption layer and the amorphous boron nitride film.

25. A display device comprising:

a display panel; and the amorphous boron nitride film of claim 1 on the display panel.

26. The display device of claim 25, wherein a refractive index of the amorphous boron nitride film with respect to light in a wavelength range of about 100 nm to about 1000 nm is about 1.0 to about 1.5.

27. The display device of claim 25, further comprising:

a protection film between the display panel and the amorphous boron nitride film.

28. The display device of claim 27, wherein a refractive index of the protection film is greater than a refractive index of the amorphous boron nitride film.

* * * * *